United States Patent [19]
Manley et al.

[11] Patent Number: 5,815,388
[45] Date of Patent: Sep. 29, 1998

[54] POLARITY REVERSING CIRCUIT HAVING ENERGY COMPENSATION

[75] Inventors: Barry W. Manley, Boulder, Colo.;
Keith H. Billings, Guelph, Canada;
Lance J. Collins, Superior, Colo.

[73] Assignee: Sierra Applied Sciences, Inc., Boulder, Colo.

[21] Appl. No.: 898,481

[22] Filed: Jul. 22, 1997

Related U.S. Application Data

[63] Continuation-in-part of Ser. No. 667,417, Jun. 21, 1996, Pat. No. 5,682,067.

[51] Int. Cl.⁶ .............................. H02M 7/02; C23C 14/34
[52] U.S. Cl. .............................. 363/63; 307/45; 307/127; 307/128; 361/245
[58] Field of Search ...................................... 307/127, 138, 307/45; 363/63; 361/245; 204/192.12, 192.14, 298.08; 323/239, 324

[56] References Cited

U.S. PATENT DOCUMENTS

| | | |
|---|---|---|
| 4,103,324 | 7/1978 | Vandervelen et al. . |
| 4,366,390 | 12/1982 | Rathmann ................................. 307/66 |
| 4,719,550 | 1/1988 | Powell et al. .............................. 363/37 |
| 4,914,356 | 4/1990 | Cockram .................................. 315/307 |
| 4,931,169 | 6/1990 | Scherer et al. . |
| 4,936,960 | 6/1990 | Siefkes et al. . |

(List continued on next page.)

FOREIGN PATENT DOCUMENTS

| | | |
|---|---|---|
| 0553410 A1 | 8/1993 | European Pat. Off. . |
| 221202 A1 | 4/1985 | German Dem. Rep. . |
| 229160 A1 | 10/1985 | German Dem. Rep. . |
| 3919147 A1 | 12/1990 | Germany . |
| 3121389 A1 | 8/1992 | Germany . |
| 4113704 A1 | 10/1992 | Germany . |
| 57-69324 (A) | 4/1982 | Japan . |
| 61-30665 (A) | 2/1986 | Japan . |
| 63-190168 (A) | 8/1988 | Japan . |
| 3-56671 (A) | 3/1991 | Japan . |
| 3-61368 (A) | 3/1991 | Japan . |
| 2045553 | 3/1980 | United Kingdom . |

OTHER PUBLICATIONS

Beisswenger, T. et al., "Economical Considerations on Modern Web Sputtering Technology", Society of Vacuum Coaters, 35th Annual Technical Coinferece Proceedings, pp. 128–134 (1992).

Anderson, L., "A New Technique for Arc Control in DC Sputtering", Society of Vacuum Coaters, 35th Annual technical Conference Proceedings, pp. 325–329 (1992).

Schatz, Doug, "The MDX as a Strategic Tool in reducing Arcing", Applications Notes, Advanced Energy Industries, Inc. (1985).

*Primary Examiner*—Adolf Berhane
*Attorney, Agent, or Firm*—Klaas, Law, O'Meara & Malkin, P.C.; Bruce E. Dahl, Esq.

[57] ABSTRACT

A polarity reversing circuit having energy compensation may comprise a first inductor connected between the first electrode and a negative terminal of a power supply. The positive terminal of the power supply is connected to the second electrode. A diode and a first capacitor are connected in series across the first inductor so that the cathode of the diode is connected to the first electrode. A second capacitor and a switching device are also connected in series across the first and second electrodes. A second inductor is connected between the switching device and the anode of the diode. A bi-directional converter is connected between the power supply and the second capacitor. The voltage polarity between the first and second electrodes may be reversed by actuating the switching device to switch between a non-conducting state and a conducting state. The voltage polarity may be returned to the normal polarity by again actuating the switching device to switch it from the conducting state to the non-conducting state. A bi-directional converter transfers electrical energy between the polarity reversing circuit and the power supply to compensate for variations in the amount of energy reflected by the electrodes during operation.

28 Claims, 8 Drawing Sheets

U.S. PATENT DOCUMENTS

| | | |
|---|---|---|
| 4,963,238 | 10/1990 | Siefkes et al. . |
| 4,981,566 | 1/1991 | Wurczinger . |
| 5,006,213 | 4/1991 | Sichmann et al. . |
| 5,009,764 | 4/1991 | Siefkes et al. . |
| 5,015,941 | 5/1991 | Dhyanchand ............................ 322/10 |
| 5,074,984 | 12/1991 | Sichmann et al. . |
| 5,108,571 | 4/1992 | Ludwig et al. . |
| 5,109,162 | 4/1992 | Koch et al. ............................. 307/127 |
| 5,126,033 | 6/1992 | Szczyrbowski et al. . |
| 5,187,473 | 2/1993 | Guest ................................. 340/854.4 |
| 5,192,894 | 3/1993 | Teschner . |
| 5,373,195 | 12/1994 | De Doncker et al. .................... 307/45 |
| 5,427,669 | 6/1995 | Drummond . |
| 5,682,067 | 10/1997 | Manley et al. .......................... 307/127 |

POLARITY REVERSING CIRCUIT HAVING ENERGY COMPENSATION

CROSS REFERENCE TO RELATED APPLICATION

This is a continuation in part of U.S. application, Ser. No. 08/667,417, filed on Jun. 21, 1996 now U.S. Pat. No. 5,682,067.

FIELD OF INVENTION

This invention relates to plasma processing systems in general and more specifically to power supplies for D.C. plasma processing systems.

BACKGROUND

Plasma deposition is the name given to any of a wide variety of processes in which a plasma is used to assist in the deposition of thin films or coatings onto the surfaces of objects. For example, plasma deposition processes are widely used in the electronics industry to fabricate integrated circuits and other electronic devices, as well as to fabricate the magnetic tapes and disks used in audio, video, and computer applications. Such plasma deposition processes may also be used in reverse, i.e., to remove material from the surfaces of objects, in which case they are usually referred to as plasma etching or plasma cleaning processes.

Regardless of whether the plasma process is used for deposition or cleaning, the plasma is usually created by subjecting a low-pressure process gas (e.g., argon) contained within a vacuum chamber to an electric field created between two electrodes. The electric field ionizes the process gas, creating the plasma. In the case of a sputter deposition plasma process, the ionized process gas atoms comprising the plasma impact the surface of the material (i.e., target) that is to be deposited on the object (i.e., substrate). As a result of the ion impacts, atoms of the target material are dislodged or sputtered from the surface of the target material and are released into the vacuum chamber. The substrate is usually positioned with respect to the target so that a majority of the sputtered atoms from the target material deposit themselves onto the surface of the substrate.

While sputter deposition processes of the type described above may be used to deposit metals or metal alloys (e.g., aluminum, nickel or cobalt) onto the substrate, they may be used to deposit compounds as well. Reactive sputter deposition is the name usually given to reactive sputtering processes which involve the sputtering of a metal or metal alloy in a reactive gas mixture in order to deposit a compound thin film comprising the sputtered material and the reactive species. A wide variety of compounds, such as $SiO_2$, $Al_2O_3$, $Si_3N_4$, and $TiO$, can be deposited by reactive sputtering.

While reactive sputtering processes are known and have been used for years, they continue to be plagued by the periodic occurrence of electrical discharges or arcs within the vacuum chamber. Such electrical discharges or arcs can take on different forms depending on the characteristics of the sputtering apparatus and on the particular plasma process being used. For example, arcs may occur between the target material, which is typically connected as the cathode in a DC sputtering process, and the substrate itself, certainly causing a defect in the coating, if not ruining the substrate entirely. Alternatively, the arc may occur between the target and some other part of the vacuum chamber, in which case the deleterious effects of the arc are usually less severe, but nevertheless tend to degrade the overall quality of the coating. The arcs can be short lived, lasting only a few milliseconds or so, or may be continuous, again depending on the particular apparatus and process being used. While such arcing can occur in nearly every kind of plasma process, the tendency of such arcs to occur is much greater in reactive processes where the compound film being deposited is an electrical insulator, such as $Al_2O_3$.

Several methods for preventing, or at least reducing the frequency of such arc discharges, rely on the selective control of the power supply used to place the charge on the electrodes. For example, one such method has been to simply turn-off the power supply as soon as an arc is detected, then turn it back on again once the arc has dissipated. While this method can effectively quench sustained arcs, the stored energy in most power supplies takes time to dissipate, increasing the response time, i.e., the time it takes to remove the electrical potential from the electrodes, to the point where such devices cannot effectively quench short duration arc events. Consequently, all that is really accomplished is a reduction in overall deposition rate, with little or no reduction in the adverse effects produced by the arc event itself.

Another control method has been to momentarily interrupt (i.e., disconnect) the power supply from the electrodes during the arc event. While the response time of this method is usually considerably faster, i.e., the voltage can be removed from the electrodes within a few milliseconds or so, it is difficult to dissipate the stored energy in the power supply. Consequently, such methods tend to stress the power supply or switching devices used to disconnect the power supply to the point of burn-out.

Another method of interrupting the voltage placed on the electrodes has been to use a tapped inductor connected in series between one terminal of the power supply and one of the electrodes. When an arc is detected, the center tap of the inductor is momentarily connected to the other terminal of the power supply. This has the effect of momentarily reversing the voltage on the electrodes. In certain cases, the magnitude of the reversed voltage charge is usually sufficient to quench the arc. Unfortunately, however, this method is not effective in suppressing arcs having impedances lower than the impedance of the switching network and center tap, which is a common occurrence. Consequently, the use of such center-tapped inductors has not proven to be a panacea.

While other devices exist and are being used with some degree of success, none are without their disadvantages. For example, may such other devices can only effectively suppress certain types of arc events or only arcs created under certain conditions. Other devices may have more effective arc suppression characteristics, but are usually plagued with complex electronic circuits and devices, which may be expensive to produce and/or prone to failure.

Consequently, a need exists for a method and apparatus for preventing and/or suppressing arc events in plasma processes and under various operating conditions. Such a method and apparatus should allow for the effective suppression of arcs under a wide range of conditions, but without the need to resort to expensive or complex circuit elements. Additional advantages could be realized if such a device could be used in conjunction with conventional power supplies.

SUMMARY OF THE INVENTION

A polarity reversing circuit having energy compensation may comprise a first inductor connected between the first electrode and a negative terminal of a power supply. The positive terminal of the power supply is connected to the second electrode. A diode and a first capacitor are connected in series across the first inductor so that the cathode of the diode is connected to the first electrode. A second capacitor and a switching device are also connected in series across the first and second electrodes. A second inductor is connected between the switching device and the anode of the diode. A bi-directional converter is connected between the power supply and the second capacitor. The voltage polarity between the first and second electrodes may be reversed by actuating the switching device to switch between a non-conducting state and a conducting state. The voltage polarity may be returned to the normal polarity by again actuating the switching device to switch it from the conducting state to the non-conducting state. A bi-directional converter transfers electrical energy between the polarity reversing circuit and the power supply to compensate for variations in the amount of energy reflected by the electrodes during operation.

BRIEF DESCRIPTION OF THE DRAWINGS

Illustrative and presently preferred embodiments of the invention are shown in the accompanying drawings in which.

DETAILED DESCRIPTION OF THE INVENTION

Figure 1:
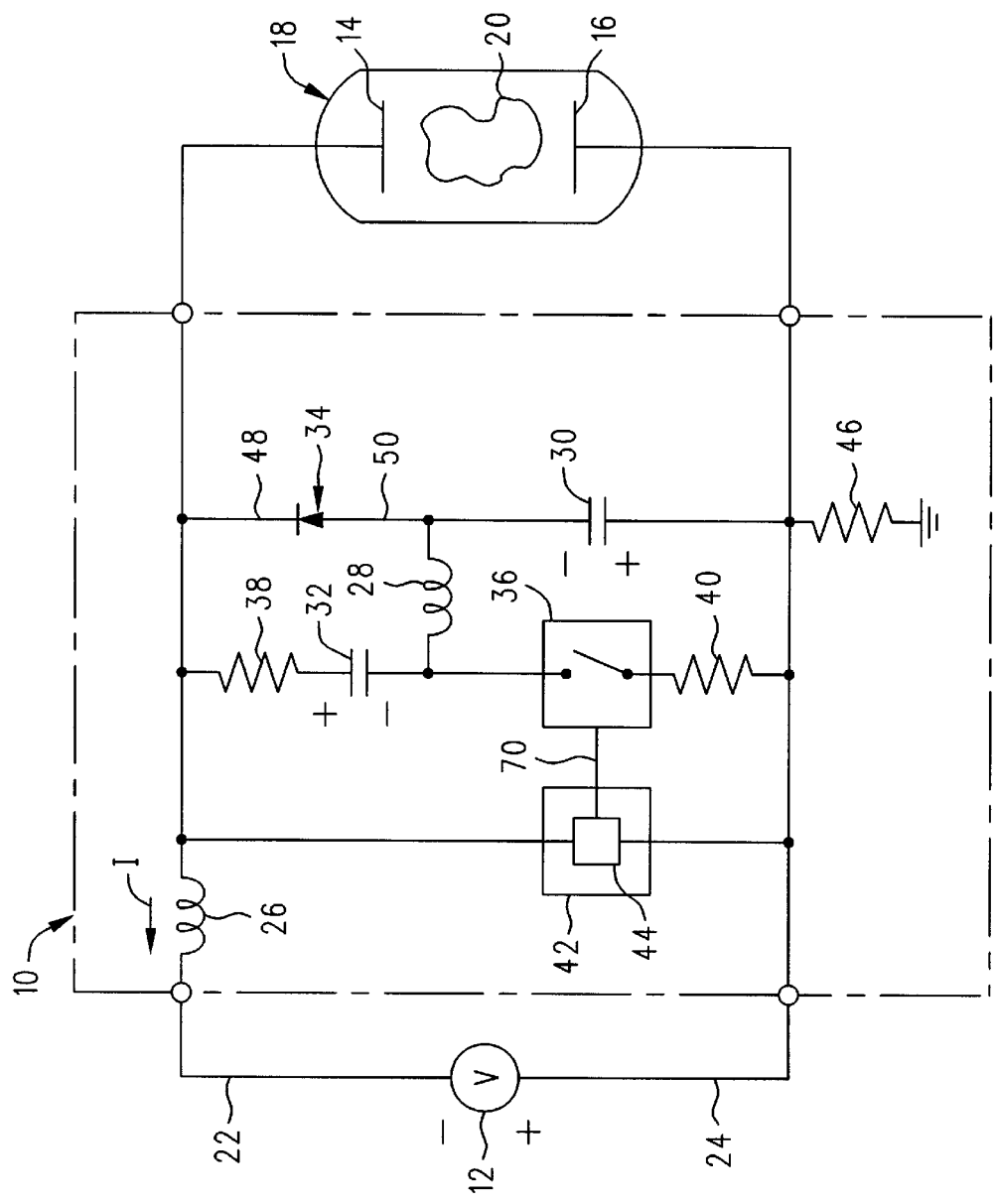
FIG. 1 is a schematic of a first embodiment of a circuit for reversing the polarity between two electrodes according to the present invention.

The improved circuit 10 for reversing the voltage potential on two electrodes according to one embodiment of the present invention is shown in FIG. 1 as it could be used with a conventional power supply 12 adapted for applying an electrical voltage potential between a first electrode 14 and a second electrode 16 mounted within a vacuum chamber 18. The vacuum chamber 18 may also include various other devices such as vacuum pumps, pressure regulators, cooling systems, etc., (not shown) that may be required to introduce into the vacuum chamber 18 the process gas (e.g., argon) and to maintain the pressure of the process gas within predetermined limits. In the case of a reactive plasma deposition process, the vacuum chamber 18 may also include additional, but similar, apparatus (also not shown) required to introduce into the vacuum chamber 18 the reactive gas (e.g., oxygen) and to maintain its pressure within predetermined limits.

The electric field created between the first and second electrodes 14 and 16 by the power supply 12 ionizes the process gas (not shown) to produce a plasma 20 for accomplishing the desired process (e.g., deposition or etching, as the case may be). In the embodiment shown in FIG. 1, the first electrode 14 is connected to the negative (−) terminal of the power supply 12 by any suitable connecting means, such as conductor 22. Similarly, the second electrode 16 is connected to the positive (+) terminal of power supply 12 via conductor 24. Therefore, the first electrode 14 serves as the cathode and the second electrode 16 serves as the anode.

The improved circuit 10 for momentarily reversing the polarity on the first and second electrodes 14, 16 (i.e, cathode and anode, respectively) is electrically positioned between the conductors 22 and 24 and may comprise a first inductor 26 connected in series between the negative (−) terminal of the power supply 12 and the first electrode 14 (e.g., the cathode). The first inductor 26 allows the power supply 12 to deliver a substantially constant current to the plasma 20 regardless of short duration voltage fluctuations that may occur as a result of changes in the plasma 20 or the overall process contained within vacuum chamber 18.

A first capacitor 30, along with a diode 34, are connected between the first and second electrodes 14 and 16 in the manner shown. A second capacitor 32 and a switching device 36 are also connected between the first and second electrodes 14 and 16 in a generally parallel arrangement with respect to the first capacitor 30 and diode 34. A second inductor 28 is connected between the first and second capacitors 30 and 32. As will be described in greater detail below, an optional first resistor 38 may be connected in series between the second capacitor 32 and the first electrode 14, and an optional second resistor 40 may be connected between the switching device 36 and the second electrode 16. Similarly, an optional third resistor 46 may be connected between the second electrode 16 and ground.

The circuit 10 may also include a switch actuation circuit 42 for periodically cycling the switching device 36 between a non-conducting (e.g., open) state and a conducting (e.g., closed) state. In one preferred embodiment, the switch actuation circuit 42 may also include an arc detection circuit 44 for detecting the occurrence of an arc condition.

As will be explained in greater detail below, the second inductor 28, along with the respective first and second capacitors 30 and 32, forms an LC (i.e., inductive-capacitive) circuit which transfers energy stored in the second inductor 28 and first capacitor 30 into the second capacitor 32 during those times when the switching device 36 switches between the conducting state and the non-conducting state. Further, the first capacitor 30, along with diode 34, functions as a voltage limiter or clamp to prevent excessive negative voltages from being imposed on the cathode 14 immediately following the opening of switch device 36.

The improved circuit 10 according to the present invention may be operated in one of two modes depending on the desired performance of the circuit. In the first mode, referred to herein as the "passive arc suppression mode," the circuit 10 is operated in such a manner that the switch actuation circuit 42 periodically closes the switching device 36, thus reversing the polarity on the electrodes 14, 16. This periodic reversing of the polarity on the electrodes 14, 16 tends to remove any space charge that may have accumulated on the electrodes 14, 16, thereby effectively preventing the development of conditions likely to lead to arcing. In most processing modes, such a periodic voltage polarity reversal will be sufficient to prevent the occurrence of arcs. However, in the event more robust arc suppression is desired or required, the circuit 10 may be provided with an optional arc detection circuit 44.

When provided with the arc detection circuit 44, the overall circuit 10 may be operated in an "active arc suppression mode" in which the switching device 36 is actuated any time an arc condition is detected. As explained above, the actuation of the switching device 36 has the effect of almost immediately reversing the voltage potential on the electrodes 14 and 16, thus quenching the arc before it has a chance to fully develop and adversely affect the coating process.

Figure 2:
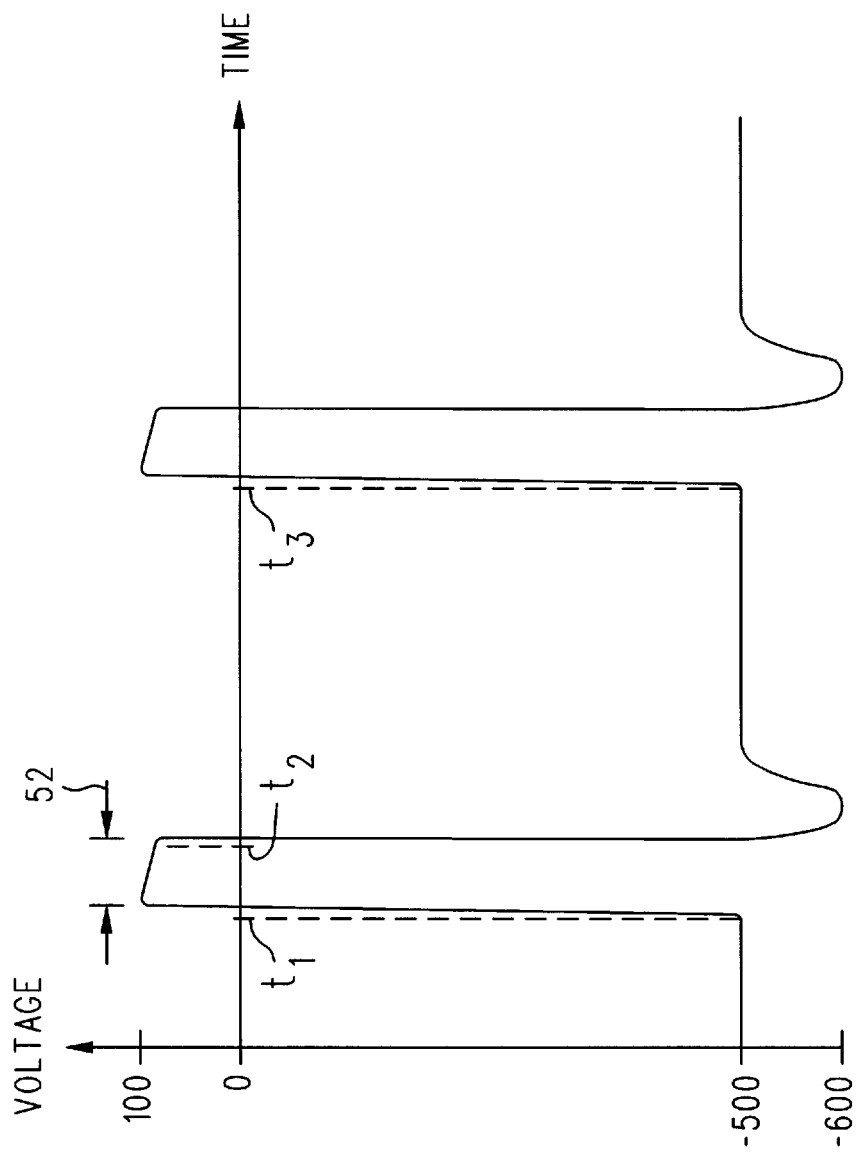
FIG. 2 is a graph of a typical voltage signal imposed on one of the two electrodes by the circuit according to the present invention.

The operation of the circuit 10 in the passive arc suppression mode is best understood by referring to FIGS. 1 and 2. In order to accomplish the desired plasma deposition process, the voltage on the first electrode 14 (i.e., the cathode) is maintained at a strong negative potential (e.g., −500 volts (V)) with respect to the second electrode 16 (i.e., the anode) during the time when the switching device 36 is in the non-conductive state (i.e., open). During this time, the process is more or less operating in a steady state, with a substantially constant current I flowing through the first inductor 26 in the direction indicated by the arrow (i.e., the direction of positive current flow). As will be explained in greater detail below, the second capacitor 32 will have a net reverse charge (indicated by the "+" and "−" signs) across its plates with respect to the polarity of the electrodes 14 and 16. That is, the plate connected to the first electrode 14 will have a voltage potential substantially equal to the voltage potential on the electrode 14 (e.g., −500 V), while the other plate, i.e., the plate connected to the second inductor 28, will have a slightly greater negative voltage (e.g., −600 V). Consequently, the second capacitor will have a relative charge as indicated by the (+) and (−) signs shown in FIG. 1. The first capacitor 30 will essentially have the relative charge in the sense also indicated by the (+) and (−) signs shown in FIG. 1.

At a certain time $t_1$ (FIG. 2), the switch actuation circuit 42 actuates the switching device 36 to change it from the non-conductive (i.e., open) state to the conductive (i.e., closed) state. The second capacitor 32 will now be connected directly across the first and second electrodes 14 and 16, essentially instantly reversing the charge on the electrodes. That is, the charge on the first electrode 14 will now be essentially 100 volts (V) positive with respect to the charge on the second electrode 16. See FIG. 2. This 100 volt potential, plus the 500 volt potential of the power supply, i.e., a total of 600 volts, is impressed across inductor 26, causing the current I flowing through the first inductor 26 to increase in a substantially linear fashion.

Before the second capacitor 32 is discharged by a significant amount, the switch actuation circuit 42 again actuates the switching device 36, causing it to return to the non-conductive (i.e., open) state at a time $t_2$. At this point, the increased current I flowing through the first inductor 26 causes the voltage on the first electrode 14 to more or less instantly swing negative with respect to the second electrode 16. However, instead of stopping at the previous potential of about −500 V, the increased current I flowing through the first inductor 26 and the increased initial impedance of the non-conducting plasma 20 causes the voltage on the first electrode 14 to continue to go negative. The first capacitor 30 and the diode 34 now act as a voltage limiter or clamp to prevent the voltage on the first capacitor 30 from exceeding about −600 volts. The clamped energy is stored in capacitor 30. Then, as the plasma begins to conduct, the voltage on the first electrode decreases until it again reaches about −500 volts with respect to the second electrode 16 and the current I through the first inductor 26 decays to its original value. The switching device 36 remains in the non-conducting (i.e., open) state until a time $t_3$, when it is again switched to the conducting (i.e., closed) state and the cycle repeated, as described above.

The second inductor 28 prevents excessive current from flowing through the switching device 36 when it is conducting. The second inductor 28 also provides resonant recharging of the second capacitor 32 from the first capacitor 30 when the switching device 36 is in the non-conducting state. That is, the charge collected by the first capacitor 30 during the clamping process is transferred to the second capacitor 32 when switching device 36 is in the non-conducting state.

If the circuit 10 is provided with an arc detection circuit 44, then it may be operated in the "active arc suppression mode." The active arc suppression mode is essentially identical to the passive arc suppression mode except that the switching device 36 is activated (i.e., closed) whenever an arc condition is detected by the arc detection circuit 44. Therefore, when operated in the active mode, the circuit 10 will be capable of quenching an arc that may unexpectedly develop during the time between the periodic voltage reversal cycles 52, e.g., during the time between $t_2$ and $t_3$.

A significant advantage of the improved circuit 10 according to the present invention is that it allows the voltage potential between the electrodes 14, 16 to be almost instantly reversed to discourage the formation of an arc condition within the plasma chamber 18. Unlike previous circuits, the improved circuit 10 transfers the energy stored in the first capacitor 30, the first inductor 26, and the vacuum chamber 18 during the voltage reversal (i.e., chamber restart) period into the second capacitor 32, thus preventing undue stress from being imposed on the power supply 12 or the switching device 36, thus substantially increasing the reliability and overall lifetime of both devices. Another advantage of the present invention is that it does not require complex circuitry or components, which can be expensive and subject to failure. Still another advantage is that the improved circuit 10 according to the present invention may be used with conventional power supplies without the need to modify the power supplies.

Still other advantages are associated with the combination of the first and second capacitors 30 and 32 and the second inductor 28. These circuit elements together form an LC resonant circuit whereby the energy stored in the first capacitor 30 during clamping is transferred first to the second inductor 28 and then to the second capacitor 32 when the switching device 36 is in the non-conducting state. This stored energy is then transferred from those elements back into the plasma circuit upon resumption of normal operation. Consequently, very little energy is wasted, nor is there a concern about the energy stored in the chamber 18 and inductor 26 damaging the internal components of the power supply 12 or the switching device 36.

Yet another advantage of the present invention 10 is that the first capacitor 30 and diode 34 form a voltage limiter or clamp to prevent the first inductor 26 from imposing excessive negative voltages on the first electrode 14 when the switching device 36 is opened. Instead, the energy is stored in the second inductor 28 and the first and second capacitors 30 and 32, and is later used to reverse the voltage on the electrodes 14 and 16.

Having briefly described the improved circuit 10 for reversing the voltage polarity on electrodes, as well as some of its more significant features and advantages, the details of the improved circuit 10 according to the present invention will now be described in detail. Referring back now to FIG. 1, the improved circuit 10 is shown as it may be used in conjunction with a conventional DC power supply 12 of the constant voltage design. However, other types of power supplies, such as constant current power supplies, could also be used. In the case of a DC plasma sputter deposition process, the negative (−) terminal of the power supply 12 is connected to the first electrode 14 by any convenient connector means, such as a conductor 22. Similarly, the positive (+) terminal of the power supply 12 may be connected to the second electrode 16 by a second conductor 24. When connected in this manner, the first electrode 14 is said to be the cathode and the second electrode 16, the anode.

The first and second electrodes 14 and 16 are positioned within a vacuum chamber 18 and may be connected in any of a variety of ways well-known in the art depending on the particular plasma process to be performed. For example, if sputter deposition is to be performed within the chamber 18, a target (not shown) is usually connected as the cathode or first electrode 14. The second electrode 16 or anode may comprise a separate component or, as is commonly the case, may comprise the vacuum chamber 18 itself. Of course, the vacuum chamber 18 may also include a variety of other components and devices necessary to accomplish the desired plasma process. For example, the vacuum chamber 18 will usually be connected to a supply of a suitable process gas (not shown), such as argon, as well as a suitable pumping apparatus (also not shown) to maintain the process gas contained within the chamber 18 at the desired pressure. If reactive sputtering is to be performed, then the vacuum chamber 18 will also be connected to a supply of the reactive species (not shown), such as oxygen. A valve assembly (not shown) will also usually be included to allow for the precise adjustment of the flow of the reaction gas into the chamber 18. The vacuum chamber 18 may also include various other systems, such as cooling systems, process monitoring systems, etc., all of which are well-known in the art and could be easily provided by persons having ordinary skill in the art. Consequently, the vacuum chamber 18 will not be described in further detail.

The voltage reversal circuit 10 comprises a first inductor 26 connected in series with the negative (−) terminal of power supply 12 and the first electrode (i.e., cathode) 14 contained within the vacuum chamber 18. The first inductor 26 adds a substantial amount of reactance to the circuit 10 thus allowing the plasma process to operate at substantially constant current, at least for short term transient impedance variations that may occur in the plasma 20. That is, the current flowing through the plasma 20 will be substantially constant regardless of the voltage potential between the two electrodes 14 and 16. While the amount of inductance of the first inductor 26 is not particularly critical, it should be large enough to provide sufficient reactance to the circuit to allow the plasma process to be operated at substantially constant current for the typically expected transient impedance variations in the plasma 20. In one preferred embodiment, the first inductor 26 comprises a 1.5 millihenry (mH) choke.

The cathode 48 of diode 34 is also connected to the first electrode 14, whereas the anode 50 is connected to one lead of a first capacitor 30. The other lead of first capacitor 30 is connected to the second electrode 16. As was described above, the series arrangement of the first capacitor 30 and diode 34 forms a voltage limiter or clamp to prevent excessive negative voltages from being imposed on the first electrode 14 when the switching device 36 is opened. The selection of the diode 34 will, of course, depend on the capacity of the particular power supply 12, the expected peak voltages and currents, as well as the values chosen for the other components in the circuit 10. However, in one preferred embodiment, the diode 34 may comprise a single diode rated for 800 volts and 6 amperes (A). Alternatively, a combination of diodes may be used, as would be obvious to persons having ordinary skill in the art.

The value of the first capacitor 30 must be selected so that it will not discharge significantly during the longest conducting period of switching device 36 at the maximum load current, i.e., the time between $t_1$ and $t_2$. Further, the LC resonant circuit that comprises the first and second capacitors 30 and 32 and the second inductor 28 should have a sufficiently long time constant so that the second capacitor 32 will be positively charged when the switching device 36 is again switched to the conducting state. The range of values for the first capacitor 30 will be described later.

The second capacitor 32 and the switching device 36 are connected in series across the first and second conductors 22 and 24 in the manner shown in FIG. 1. It is preferred, but not required, that a first resistor 38 be connected in series between the capacitor 32 and the conductor 22 and a second resistor 40 be connected in series between the switching device 36 and the conductor 24. Although both resistors 38 and 40 act as current limiters to protect their associated components, resistor 40 also provides current limiting information to the switch actuation circuit 42. In one preferred embodiment, the first resistor 38 may have a value in the range of 1 ohm ($\Omega$) to 50 $\Omega$ (8 $\Omega$ preferred). The second resistor 40 may have a value in the range of 10 milliohms (m$\Omega$) to 100 m$\Omega$ (50 m$\Omega$ preferred). Finally, the second inductor 28 is connected between the first and second capacitors 30 and 32, respectively.

As was described above, the first and second capacitors 30 and 32, along with the second inductor 28, form an LC resonant circuit. In order to provide good performance, the time constant of the resonant circuit should be selected so that it is at least four (4) times longer than the expected length of the non-conducting period of switching device 36 (i.e., the period between $t_2$ and $t_3$) at the slowest cycle rate. See FIG. 2. It is preferred, but not required, that the time constant of the LC resonant circuit be about one (1) order of magnitude (i.e., about 10 times) longer than the length of the non-conducting period (i.e., $t_3-t_2$). Thus, in one preferred embodiment having a non-conducting time period $t_3-t_2$ in the range of 20–60 microseconds ($\mu$s), the time constant of the resonant circuit should be selected to be about 600 $\mu$s. Therefore, any values for the second inductor 28 and the first and second capacitors 30 and 32 that will yield such a time constant usually will suffice. In one preferred embodiment, the first capacitor 30 has a value in the range of about 1 microfarad ($\mu$F) to 10 $\mu$F (1 $\mu$F preferred), the second capacitor 32 a value in the range of 1 $\mu$F to 10 $\mu$F (1 $\mu$F preferred), and the inductor 28 has a value of about 5 millihenries (mH) to 10 mH (10 mH preferred).

The switching device 36 may comprise any number of semiconductor switching devices suitable for switching the anticipated currents at a suitable speed (e.g., 0.1 $\mu$s). Examples of such semiconductor switching devices include, but are not limited to, bi-polar transistors, insulated gate bi-polar transistors (IGBTs), field-effect transistors (FETs), metal-oxide semiconductor field-effect transistors (MOSFETs), etc., that are readily commercially available and well-known to persons having ordinary skill in the art. Alternatively, non-semiconductor switching devices may also be used, provided such devices are capable of switching the anticipated voltages and currents at the speeds required. Consequently, the present invention should not be regarded as limited to any particular switching device or family of switching devices. However, in order to assist in the understanding of the circuit 10, the switching device 36 used in one particular embodiment will now be described.

Figure 3:
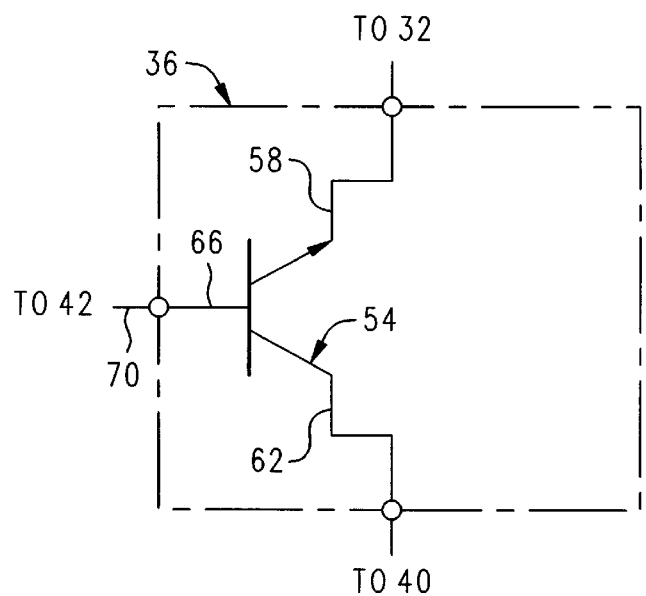
FIG. 3 is a schematic of one embodiment of a switching device that could be used with the present invention.

Referring to FIG. 3, one type of switching device 36 may comprise a single high-speed bi-polar switching transistor 54. More specifically, the emitter 58 of transistor 54 is connected to the second capacitor 32, while the collector 62 is connected to resistor 40. See also FIG. 1. The base 66 of transistor 54 is connected to the switch actuation circuit 42 (FIG. 1). In most applications, the switching device 36 must be capable of switching potentials of about 1000 V or greater and at currents commensurate with the power of the system. In one preferred embodiment, the switching transistor 54 comprises an insulated gate bi-polar transistor (IGBT) of the type which are readily commercially available. However, as was mentioned above, a number of other types of semiconductor switching devices (e.g., FETs, MOSFETs, etc.) or even non-semiconductor switching devices are available and could be substituted for the transistor arrangement set forth in FIG. 3 and described above, as would be obvious to persons having ordinary skill in the art.

The switch actuation circuit 42 may comprise any of a number of circuits well-known in the art for periodically actuating the switching device 36 to change it from a non-conducting state to a conducting state. In one preferred embodiment, the switch actuation circuit 42 would accomplish the actuation of switching device 36 by applying the appropriate base current to the transistor 54 to switch it from a non-conducting state to a conducting state at the desired time intervals. That is, the switch actuation circuit 42 should be designed to provide a switch actuation signal 70 to the switching device 36 at any of a range of frequencies suitable for providing an acceptable level of arc suppression for the particular plasma process being performed. In one preferred embodiment adapted for a reactive sputter deposition process, the switch actuation circuit activates (i.e., closes) the switching device 36 for about 2–5 μs (i.e., the reverse polarity cycle time 52 shown in FIG. 2), at a frequency of about 50 kilohertz (kHz), although other cycle times 52 and frequencies could also be used without departing from the spirit and scope of this invention.

As was mentioned above, the present invention 10 can be operated in the "passive arc suppression mode" if it does not include the optional arc detection circuit 44. When operating in the passive arc suppression mode, the switch actuation circuit 42 simply provides a switch actuation signal 70 to the switching device 36 for a time (i.e., reverse polarity cycle time 52) and at a frequency that may be appropriate for the particular plasma process being used.

The operation of the circuit 10 in the passive arc suppression mode is best understood by referring to FIGS. 1 and 2. For example, if the circuit 10 is to be used with a reactive sputter deposition process, a suitable power supply 12 is provided to maintain the voltage on the first electrode 14 (i.e., the cathode) at a negative potential (e.g., –500 volts) with respect to the second electrode 16 (i.e., the anode) during the time when the switching device 36 is in the non-conductive state (i.e., open). During this time, the reactive sputtering process (at least as far as the power supply circuit is concerned) is more or less operating in a steady state, with a substantially constant current I flowing through the first inductor 26 in the direction indicated by the arrow (i.e., the direction of positive current flow). The second capacitor 32 will have a net reverse charge (indicated by the "+" and "–" signs) across its plates with respect to the polarity of the electrodes 14 and 16. That is, the plate connected to the first electrode 14 will have a voltage potential substantially equal to the voltage potential on the electrode 14 (e.g., –500 V), while the other plate, i.e., the plate connected to the second inductor 28, will have a slightly greater negative voltage (e.g., –600 V). The first capacitor 30 will essentially have the relative charge in the sense also indicated by the (+) and (–) signs shown in FIG. 1. At a certain time $t_1$ (FIG. 2), the switch actuation circuit 42 actuates the switching device 36 to change it from the non-conductive (i.e., open) state to the conductive (i.e., closed) state. When the switching device 36 closes, the second capacitor 32 is connected directly across the first and second electrodes 14 and 16, essentially instantly reversing the voltage potential on the electrodes. That is, the charge on the first electrode 14 is now essentially 100 volts positive with respect to the charge on the second electrode 16. See FIG. 2. At this time, the second capacitor 32 begins to discharge through the power supply 12 and first inductor 26. The voltage on the second capacitor 32 plus the power supply voltage is impressed across the first inductor 26 causing the current I flowing through the first inductor 26 to increase in a substantially linear fashion in accordance with the well-known proportionality relation:

$$\frac{\Delta I}{\Delta t} \propto \frac{V}{L} \quad (1)$$

where:

V=the instantaneous voltage across the first inductor 26;
L=the inductance of the first inductor 26 at the loaded current; and
ΔI/Δt=the incremental time rate of change of the current I flowing through the inductor 26.

As was described above, the capacitance of the second capacitor 32 is selected so that it does not discharge by a significant amount before the switch actuation circuit 42 again actuates the switching device 36 causing it to return to the non-conductive (i.e., open) state at a time $t_2$. As soon as switching device 36 is opened, the increased current I flowing through the first inductor 26 causes the voltage on the first electrode 14 to more or less instantly swing negative with respect to the second electrode 16. However, instead of stopping at the previous potential of about –500 V, the increased current I flowing through the first inductor 26 and the high impedance of the plasma 20 causes the voltage on the first electrode 14 to continue to go negative. The first capacitor 30 and the diode 34 form a voltage limiter or clamp and prevent the voltage from exceeding about –100 volts greater than the normal working voltage (e.g., about –600 volts in one preferred embodiment). Then, as the current I through the first inductor 26 decays to its original value and the plasma conduction is established, the voltage on the first electrode decreases until it again reaches about –500 V with respect to the second electrode 16.

The second inductor 28 prevents excessive current from flowing through the switching device 36 and first capacitor 30 during the conducting period of the switching cycle. That is, during the conducting period, the current flowing through the second inductor 28 increases, transferring energy from the first capacitor 30 to the second inductor 28. When the switching device 36 switches to the non-conducting state (e.g., at time $t_2$), the second inductor 28 drives current into the second capacitor 32, thus recharging the second capacitor 32 for the next cycle.

Figure 4:
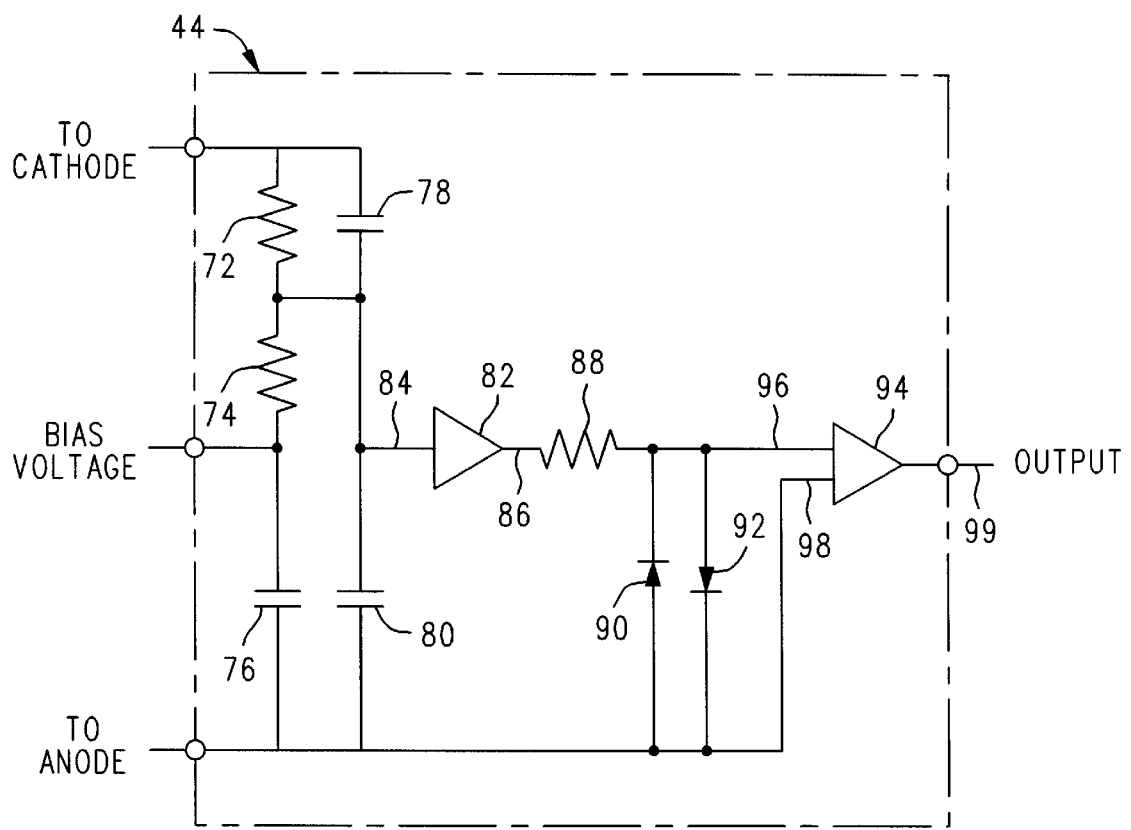
FIG. 4 is a schematic of one embodiment of an arc detection circuit that could be used with the present invention.

In certain circumstances, it may be advantageous to enhance the arc suppression capabilities of the circuit 10 described above by connecting an arc detection circuit 44 to the switch actuation circuit 42. As was mentioned above, the arc detection circuit 44 works in concert with the normal operation of the switch actuation circuit 42 to reverse the voltage potential on the electrodes 14, 16 if an arc condition is detected during the time when the switching device 36 is in the non-conductive (i.e., open) state (e.g., during the time between $t_2$ and $t_3$). While many different kinds of arc detection devices are known and may be used with the present invention, one preferred embodiment of the present invention uses an arc detection circuit 44 substantially as shown in FIG. 4.

Essentially, arc detection circuit 44 may comprise first and second resistors 72 and 74 connected in series with a first capacitor 76 across the first and second electrodes (e.g., the cathode and the anode) 14 and 16. See FIG. 1. A second capacitor 78 is connected in parallel with the first resistor 72. A third capacitor 80 is connected in series with the second capacitor 78 so that it is also connected in parallel with the series arrangement of resistor 74 and capacitor 76. The combination of resistors 72, 74 and capacitors 78 and 80 form a compensated voltage divider network which provides to the buffer amplifier 82 a reduced-voltage signal 84 that more accurately represents the actual voltage signal (i.e., wave-form) on the first and second electrodes 14 and 16, than is possible with conventional, purely resistive voltage divider networks. A bias voltage is applied to resistor 74 to define the voltage level at which an arc is to be recognized. That is, an arc condition is assumed to exist and is recognized by the arc detection circuit 44 if the voltage potential between the electrodes starts to decrease and passes through a defined voltage level. The defined voltage level can be varied by adjusting the magnitude of the bias voltage applied to resistor 74.

The reduced voltage signal 84 from the compensated voltage divider network is then fed into buffer amplifier 82. The output signal 86 from buffer amplifier 82 is fed via resistor 88 to a diode clamp circuit comprising diodes 90 and 92. Under normal circumstances, the output signal 86 from buffer amplifier 82 will be negative. Hence, current will flow via resistor 88 and diode 90 and a negative clamped voltage of about 0.6 volts will appear across the input leads 96, 98 of comparator 94. Conversely, if the output signal 86 from amplifier 82 goes positive, diode 92 will conduct, again imposing a clamped voltage of about 0.6 volts across input leads 96 and 98 of amplifier 94. The arrangement of diodes 90 and 92, along with resistor 88, forms a non-linear voltage divider network which substantially reduces the input impedance presented to the input of comparator 94, thus removing a substantial amount of the RF (i.e., radio frequency) noise present in the output signal 86. The comparator 94 produces an output signal 99 when the voltage across its input leads 96, 98 passes through zero. The output signal 99 from comparator 94 may then be fed into the switch actuation circuit 42 to trigger the switching device 36. It should be noted that in this application it will be desirable to design the arc detection circuit 44 so that it will ignore the low voltage on the first electrode 14 (i.e., cathode) if the low voltage occurs during the normal reverse polarity cycle 52 of the switch actuation circuit 42, i.e., during normal pulsing.

As was described above, the provision of an arc detection circuit, such as circuit 44, will allow the circuit 10 to be operated in either the passive arc suppression mode described above or in an active arc suppression mode. The operation of the circuit 10 in the active arc suppression mode is essentially the same as the operation of the circuit in the passive mode, except that the switch actuation circuit 42 will actuate the switching device 36 upon the detection of an arc event by circuit 44 that may occur between the normal reverse polarity cycle times 52 (e.g., during the time between $t_2$ and $t_3$). See FIG. 2. Alternatively, the polarity reversing circuit 10 could be operated in only the active arc suppression mode, i.e., without the regular, periodic pulsing (i.e., polarity reversing) associated with the passive arc suppression mode.

Figure 5:
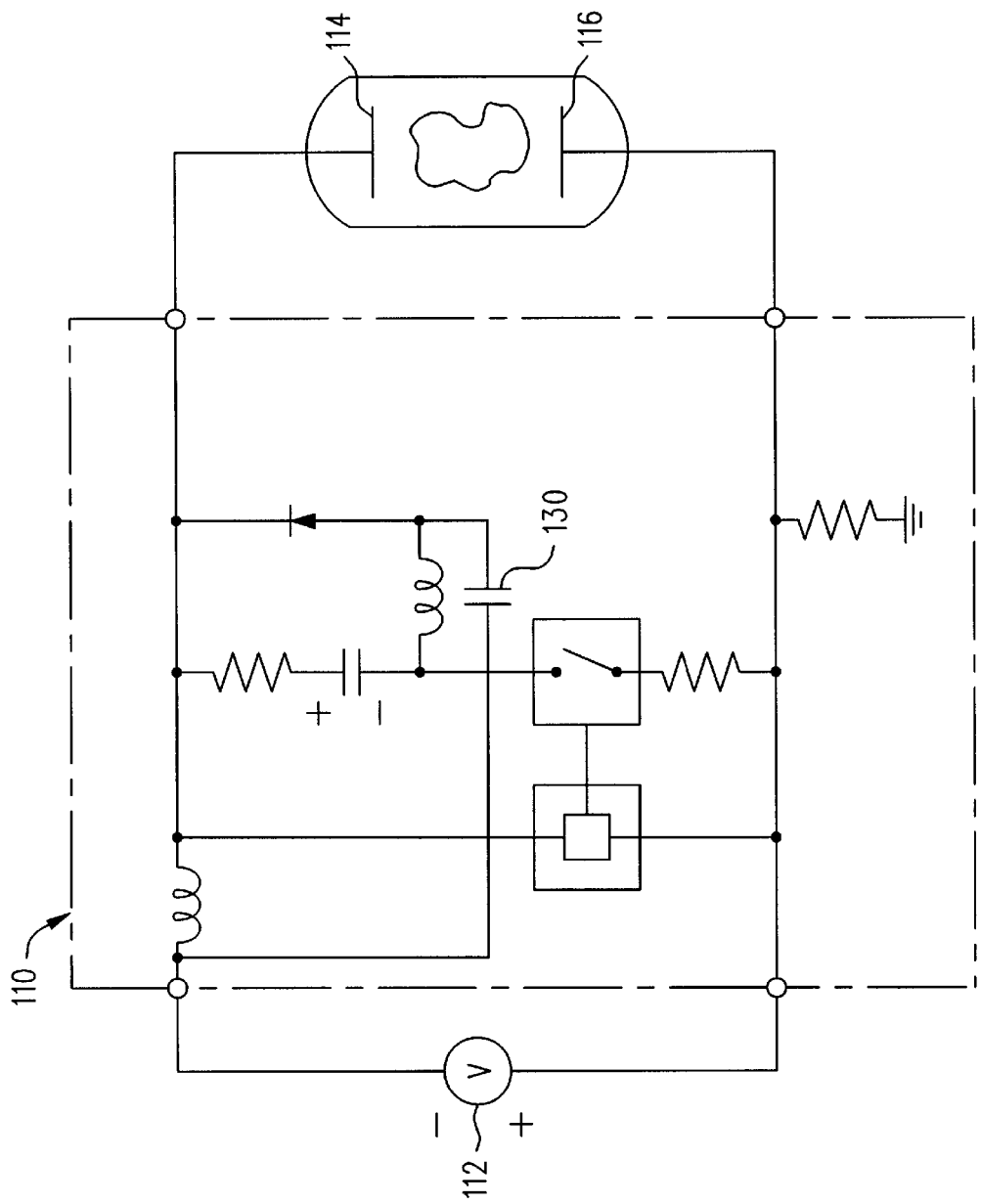
FIG. 5 is a schematic of a second embodiment of a circuit for reversing the polarity between two electrodes.

A second embodiment 110 of the circuit for reversing the voltage polarity between two electrodes 114 and 116 is shown in FIG. 5. The second embodiment 110 is essentially identical to the first embodiment 10, except that the first capacitor 130 may be connected to the negative (−) terminal of the power supply 112, instead of the positive (+) terminal, as was the case for the first embodiment 10. The function and operation of the second circuit 110 is in every way identical to the function and operation of the first circuit 10, except that the voltage potential across capacitor 130 usually will be only the difference between the normal operation negative voltage (e.g., −500 V) on the first electrode (cathode) 114 and the peak negative voltage imposed (e.g., −600 V) on the electrode 114 when the switching device 136 is opened. See FIG. 2. That is, the maximum voltage potential across capacitor 130 is only about 100 V, instead of about 600 V, which was the case for capacitor 30 in the first embodiment 10.

While the foregoing embodiments 10 and 110 of the circuit for reversing polarity on electrodes are advantageous in that they significantly reduce the likelihood of arcing, we have discovered that certain conditions (e.g., plasma phenomenon) in the vacuum chamber may result in the accumulation or depletion of energy in the polarity reversing circuit. More specifically, variations in the electrical impedance of the vacuum chamber typically result in variations in the amount of electrical power reflected by the chamber back to the polarity reversing circuit. If the reflected power is high, the result will be an accumulation of energy in the polarity reversing circuit. Conversely, if the reflected power is low, the result may be a depletion of energy in the polarity reversing circuit. The magnitude of the power reflected by the chamber back to the polarity reversing circuit depends on a wide variety of conditions and parameters, such as, for example, the process power into the chamber, the gas pressure in the chamber, cathode material, and pulsing rate, just to name a few.

Figure 6:
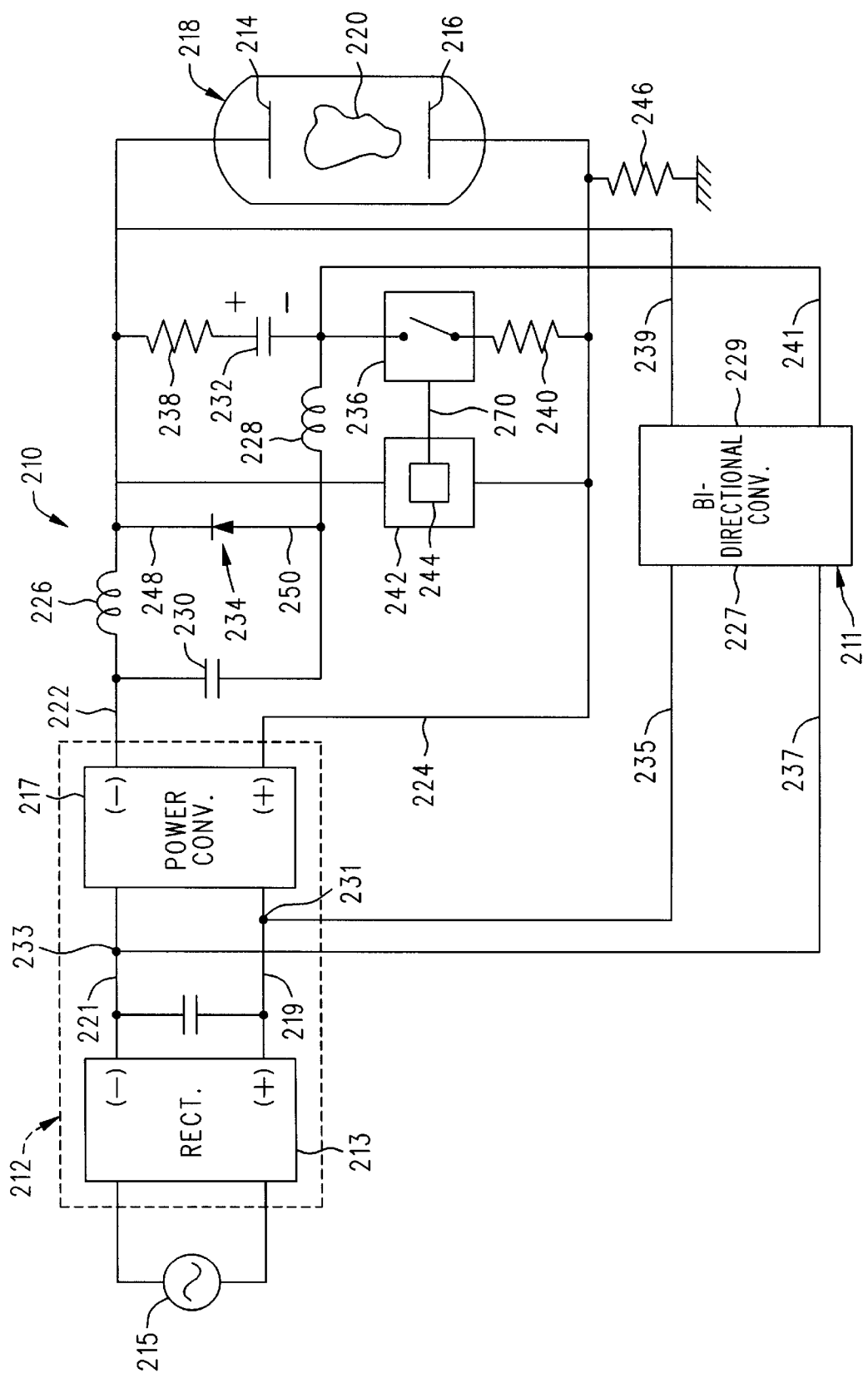
FIG. 6 is a schematic of a third embodiment of a circuit for reversing the polarity between two electrodes having a bi-directional converter circuit.

Accordingly, the various embodiments 10, 110 of the polarity reversing circuits shown and described above may be provided with a bi-directional converter circuit 211, as shown in FIG. 6. The bi-directional converter circuit 211 selectively transfers energy to and from the polarity reversing circuit 210, thereby maintaining a more constant energy level in the circuit 210. The more constant energy level in the polarity reversing circuit 210 results in more stable operation of the plasma process being carried out within the vacuum chamber 218.

In the embodiment shown in FIG. 6, the bi-directional converter circuit 211 may be connected between the power supply 212 and the polarity reversing circuit 210. Accordingly, the bi-directional converter circuit 211 may transfer energy between the power supply 212 and the polarity reversing circuit 210 in order to maintain the polarity reversing circuit 210 at about a target energy level.

The power supply circuit 212 provides the power required to place a voltage potential across a first electrode 214 and a second electrode 216 mounted within a process or vacuum chamber 218. The electric field (not shown) created between the first and second electrodes 214, 216 ionizes a process gas (also not shown) contained within the vacuum chamber 218 to produce a plasma 220. In one preferred embodiment configured to accomplish DC plasma sputtering, the first electrode 214 is connected to the negative (−) terminal of the power supply 212, while the second electrode 216 is connected to the positive (+) terminal of the power supply 212. Accordingly, the first electrode 214 serves as the cathode while the second electrode 216 serves as the anode.

In accordance with the polarity reversing circuits 10 and 110 shown and described earlier, the polarity reversing circuit 210 is electrically positioned between the electrodes 214 and 216 and may comprise a first inductor 226 connected in series between the negative (−) terminal of the power supply 212 and the first electrode 214 (i.e., the cathode). A diode 234 having a cathode 248 and an anode 250 is provided so that the cathode 248 is connected to the first electrode or cathode 214. The anode 250 of diode 234 is connected to the negative (−) terminal of the power supply 212 through a first capacitor 230. A second capacitor 232 and a switching device 236 are connected in series between the first and second electrodes 214, 216. A second inductor 228 is connected between the anode 250 of the diode 234 and the switching device 236. An optional first resistor 238 may be connected in series between the second capacitor 232 and the first electrode 214, and an optional second resistor 240 may be connected between the switching device 236 and the second electrode 216. An optional third resistor 246 may be connected between the second electrode 216 and ground.

The polarity reversing circuit 210 may also include a switch actuation circuit 242 for periodically cycling the switching device 236 between a non-conducting (i.e., open) state and a conducting (i.e., closed) state. The switch actuation circuit 242 may also include an arc detection circuit 244 for detecting the occurrence of an arc condition within the chamber 218, as was described above. Accordingly, the polarity reversing circuit 210 may be operated in either the "passive arc suppression mode" or the "active arc suppression mode," as described above, to reduce or eliminate arcing within the chamber 218.

The bi-directional converter circuit 211 transfers energy between the power supply 212 and the polarity reversing circuit 210 at a rate necessary to maintain the polarity reversing circuit 210 within a range of target energy levels. For example, if the conditions in the chamber 218 are such that there is a net energy transfer from the polarity reversing circuit 210 to the chamber 218, then the bi-directional converter circuit 211 operates in a "forward mode" to transfer power from the power supply 212 to the polarity reversing circuit 210. Conversely, if the situation is such that there is significant energy reflected by the chamber 218 back to the polarity reversing circuit 210, then the bi-directional converter circuit 211 operates in a "reverse mode" to transfer power from the polarity reversing circuit 210 back to the power supply 212.

In one preferred embodiment, the bi-directional converter circuit 211 may comprise a power supply side 227 and a chamber side 229. The power supply side 227 may be connected to respective positive and negative nodes 231, 233 in the power supply 212 by any of a wide range of suitable electrical conductors, such as by a pair of wires 235, 237. The chamber side 229 of bi-directional converter circuit 211 may be connected to the first electrode (i.e., cathode) 214 and to the second capacitor 232 by a pair of conductors, such as respective wires 239, 241, as best seen in FIG. 6.

Figure 7:
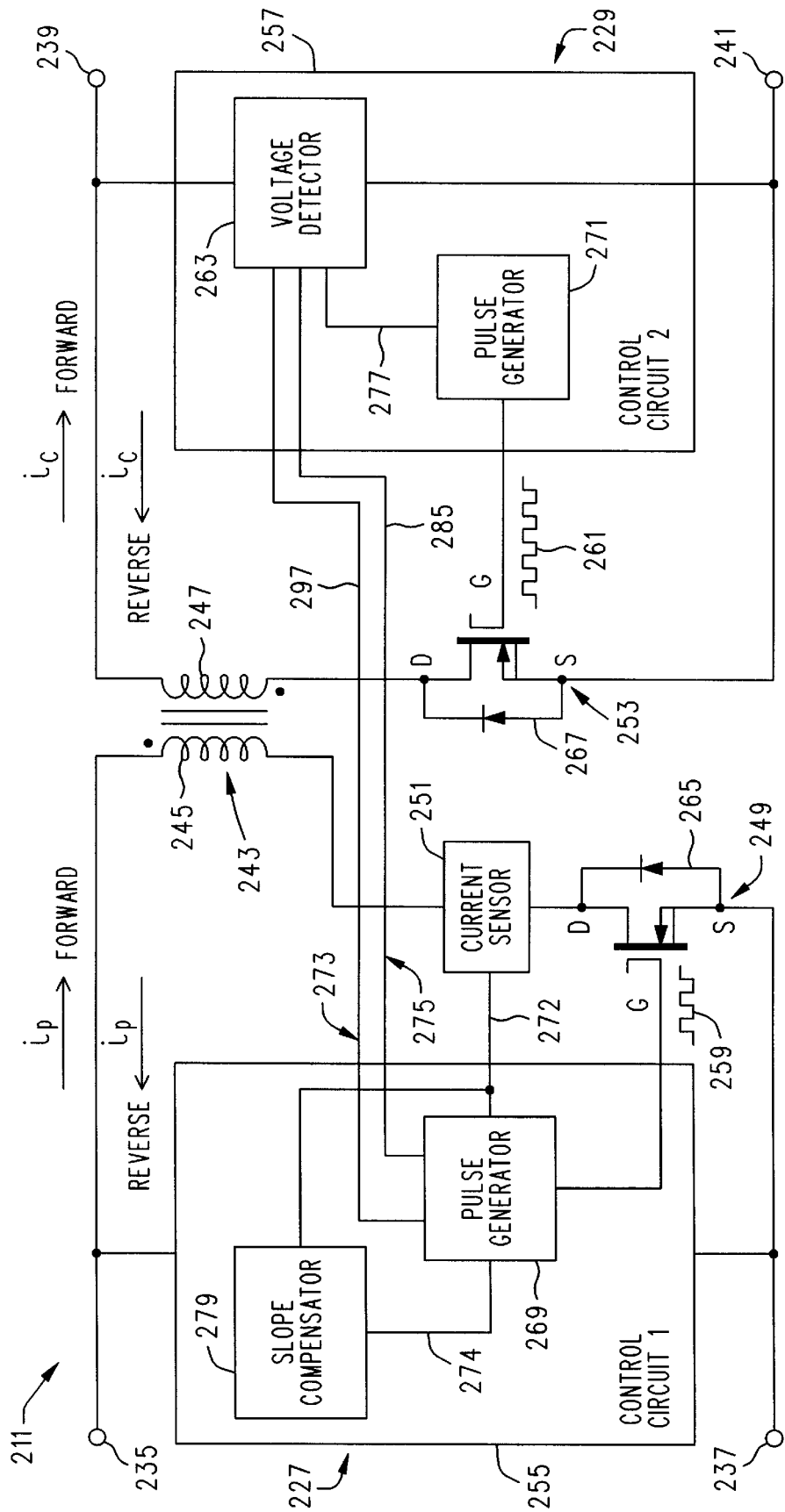
FIG. 7 is a block diagram of one embodiment of the bi-directional converter circuit.

Referring now primarily to FIG. 7, the bi-directional converter circuit 211 may comprise a transformer 243 having a first winding 245 and a second winding 247. The first winding 245 and a first winding switching device 249 are connected in series across conductors or wires 235 and 237. An optional current sensor 251 may be connected in series between the first winding 245 and first winding switching device 249, as will be described in greater detail below. The optional current sensor 251 provides current information to the first control circuit 255 to prevent excessive current from flowing through the first winding 245. The second winding 247 of transformer 243 and a second winding switching device 253 are connected in series across conductors or wires 239 and 241.

The power supply side 227 of the bi-directional converter circuit 211 also includes a first control circuit 255 that is connected to the first winding switching device 249. The first control circuit 255 may also be connected across wires 235 and 237 to provide electrical power to the first control circuit 255. Alternatively, a separate source of electrical power (not shown) may be provided to operate the first control circuit 255. Similarly, the chamber side 229 of converter circuit 211 includes a second control circuit 257 that is connected to the second winding switching device 253. The second control circuit 257 may be connected across wires 239 and 241 to provide a source of electrical power for operating the second control circuit 257. Alternatively, of course, a separate electrical power supply (not shown) may be provided to operate the second control circuit 257.

As will be described in greater detail below, the first control circuit 255 controls the operation of the first winding switching device 249; switching it between a non-conducting (i.e., open) state and a conducting (i.e., closed) state. Similarly, the second control circuit 257 switches the second winding switching device 253 between a non-conducting or open state and a conducting or closed state. The first and second control circuits 255, 257 are also connected together and cooperate to switch the bi-directional converter circuit 211 between the "forward mode," a "standby mode," and the "reverse mode."

Figure 8:
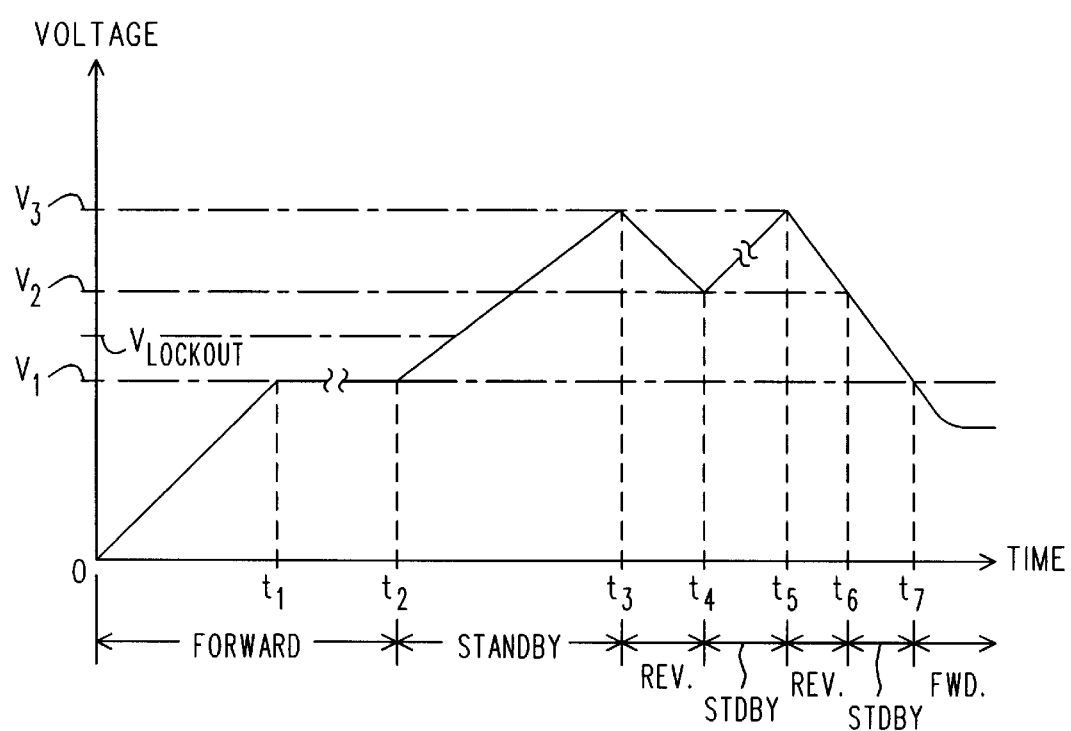
FIG. 8 is a graphical illustration of the time averaged voltage across the pulsing capacitor for several different chamber conditions.

The operation of the bi-directional converter circuit 211 is best understood by referring to FIGS. 7 and 8. In one preferred embodiment, the particular operational mode (i.e., forward, standby, or reverse) in which the bi-directional converter circuit 211 operates depends on the voltage across the second capacitor 232 (FIG. 6). The voltage across the second capacitor 232 is sensed by a voltage detector circuit 263 associated with the second control circuit 257.

Referring now to FIG. 8, when the voltage across the second capacitor 232 is less than or equal to a first voltage ($V_1$), the bi-directional converter circuit 211 operates in the "forward mode." During "forward mode" operation, the bi-directional converter circuit 211 transfers power from the power supply 212 to the polarity reversing circuit 210. The transferred power is used to maintain the voltage across the second capacitor 232 so that it is substantially equal to $V_1$, if possible.

Now, if there is a change in conditions within the vacuum chamber 218, the chamber 218 (FIG. 6) may begin to reflect additional energy back to the polarity reversing circuit 210. This additional reflected energy results in a more or less gradual increase in the voltage across the second capacitor 232. However, the energy increase need not be gradual and could instead be sudden. When this occurs, the bi-directional converter circuit 211 first enters the "standby mode" of operation. The "standby mode" of operation is initiated when the voltage on the second capacitor 232 is greater than the first voltage $V_1$ but less than a third voltage $V_3$. During the "standby mode" of operation, no energy is transferred by the bi-directional converter circuit. The "standby mode" of operation is appropriate in one preferred embodiment since moderate increases in the voltage across the capacitor 232 can be tolerated without adversely affecting the plasma process. However, other applications may not be so tolerant of such moderate voltage increases, in which case it may be desirable to reduce the range of the "standby mode" of operation.

Once the voltage across the capacitor 232 exceeds the third voltage $V_3$ the bi-directional converter circuit 211 enters the "reverse mode" of operation. In the "reverse mode" of operation, energy is transferred from the polarity reversing circuit (specifically, the second capacitor 232) back to the power supply circuit 212. This transfer of energy results in a decrease in the voltage across the second capacitor 232. The bi-directional converter circuit 211 remains in the "reverse mode" of operation until the voltage across the capacitor 232 decreases to a second voltage $V_2$ (intermediate $V_1$ and $V_3$), at which time the converter 211 returns to the "standby mode" of operation.

The effects of the various modes of operation of the bi-directional converter circuit 211 may be best understood by considering the hypothetical example shown in FIG. 8. In FIG. 8, the voltage across the second capacitor 232 is indicated along the ordinate (i.e., the vertical axis) and time is indicated along the abscissa (i.e., the horizontal axis). Consider, for example, the operation of a hypothetical plasma processing system beginning at a time t=0, at which time the polarity reversing circuit 210 is first turned on to place a voltage potential across the first and second electrodes 214, 216 (FIG. 6). The voltage potential across the second capacitor 232 is initially 0 and increases to a first voltage $V_1$ at a time $t_1$. While the voltage increase across capacitor 232 is shown increasing linearly in FIG. 8, it need not necessarily be so and could increase non-linearly as well. During this time (i.e., during the time from t=0 to t=$t_1$) the bi-directional converter circuit 211 operates in the "forward mode" and transfers energy to the polarity reversing circuit 210. The transferred energy is used to charge the second capacitor 232 until the voltage across the second capacitor 232 reaches the first voltage $V_1$.

When the voltage across the capacitor 232 reaches $V_1$, the first control circuit 255 controls the first winding switching device 249 as necessary to regulate the voltage across capacitor 232 to substantially $V_1$. In this hypothetical example, the plasma process operates in this more or less steady state (i.e., with the bi-directional converter circuit 211 maintaining the voltage across the second capacitor 232 at $V_1$) until a time $t_2$, at which time conditions in the chamber 218 change in such a way that the process chamber 218 begins to reflect additional energy back to the polarity reversing circuit 210. This additional reflected energy results in an increase in the voltage across the second capacitor 232.

When the voltage across the capacitor 232 increases beyond the first voltage $V_1$ at a time $t_2$ the first control circuit turns off (i.e., the first winding switching device 249 is placed in the non-conducting state). Since the second winding switching device 253 is also in the non-conducting state, the bi-directional converter operates in the "standby mode." That is, no energy is transferred between the power supply 212 and the polarity reversing circuit 210.

If conditions in the chamber 218 are such that there is an increase in the power reflected by the chamber 218 back to the polarity reversing circuit 210, the result will be a continuing increase in the voltage across the second capacitor 232. The bi-directional converter circuit 211 operates in the "standby mode" until the voltage across capacitor 232 reaches a third voltage $V_3$, at a time $t_3$. At this time, the bi-directional converter 211 begins to operate in the "reverse mode." When operating in the "reverse mode," the bi-directional converter circuit 211 transfers energy from the polarity reversing circuit 210 back to the power supply 212. The "reverse mode" of operation decreases the voltage across the second capacitor 232. The converter circuit 211 continues to operate in the "reverse mode" until the voltage across the capacitor 232 drops to an intermediate voltage $V_2$ at a time $t_4$, at which time it again enters the "standby mode." The bi-directional converter circuit 211 continues to operate between the "standby" and "reverse" modes to maintain the voltage across the second capacitor 232 between $V_2$ and $V_3$.

Suppose now that at a time $t_5$ conditions in the chamber 218 again change, this time reducing the amount of energy reflected by the chamber 218 back to the polarity reversing circuit 210. The reduction in reflected energy will result in a steady decrease in the voltage across capacitor 232. Once the voltage decreases below $V_2$ (i.e., at a time t=$t_6$) the bi-directional converter circuit 211 again switches to the "standby mode" until the voltage across capacitor 232 decreases to $V_1$ at a time $t_7$. The bi-directional converter circuit 211 then switches to the "forward mode" of operation.

Note that while the bi-directional converter circuit 211 will usually maintain the voltage across capacitor 232 at substantially $V_1$, certain chamber conditions may make this impossible. That is, the chamber 218 may reflect so little energy back to the polarity reversing circuit 210 that the bi-directional converter circuit 211 may have insufficient capacity to make up the difference. This condition is illustrated in FIG. 8, wherein after time $t_7$ it may only be possible to maintain the voltage across the second capacitor 232 at some voltage less than $V_1$. Of course, a bi-directional converter circuit having a larger capacity could be provided, in which case the larger capacity converter circuit may be capable of maintaining the voltage across capacitor 232 at substantially $V_1$ or greater under practically all conditions.

In accordance with the foregoing, the bi-directional converter circuit 210 maintains the polarity reversing circuit within a target range of energy levels, the target range of energy levels in one preferred embodiment corresponding to a voltage potential across the capacitor 232 between about the first voltage level $V_1$ and the third voltage level $V_3$.

A significant advantage associated with the bi-directional converter circuit 211 according to the present invention is that it provides for increased energy efficiency in that excess (i.e., reflected) energy is routed back to the power supply 212 where it may be used again instead of being dissipated as heat. Still another advantage of the bi-directional converter circuit 211 is that it expands the useful range of operating conditions for the polarity reversing circuit 210. That is, the polarity reversing circuit 210 can now be used in a wider variety of processes and over a wider range of chamber conditions without the danger of the charge on the second capacitor 232 being depleted due to insufficient energy reflection by the chamber 218. Conversely, the polarity reversing circuit 210 may also be operated without the fear of damage to the various components of the system that might otherwise occur if the chamber 218 reflects excessive energy back to the polarity reversing circuit 210.

Having briefly described the bi-directional converter circuit 211, as well as some of its more significant features and advantages, the bi-directional converter circuit according to the present invention will now be described in detail.

Referring back now to FIG. 6, one embodiment of the polarity reversing circuit 211 is shown as it could be used with a polarity reversing circuit 210 of the type described above. Specifically, the polarity reversing circuit 210 may comprise a power supply assembly 212 consisting of a rectifier circuit 213 and a power converter circuit 217. The rectifier circuit 213 rectifies an alternating current (AC) produced by an alternating current source 215 into a direct (DC) current. The DC current produced by the rectifier circuit 213 may then be fed into a power converter circuit 217 via a pair of conductors, such as wires 219, 221. Alternatively, of course, a separate direct current source (not shown) could be provided, which would eliminate the need for the alternating current source 215 and the rectifier circuit 213. Consequently, the present invention should not be regarded as limited to use with an alternating current source 215 and rectifier circuit 217.

The power converter circuit 217 may comprise a current source circuit (not shown) to provide a substantially constant current to the input conductors 222, 224 of the polarity reversing circuit 210. However, the constant current function of the power converter circuit 217 may be eliminated and replaced with a constant voltage function depending on the type of plasma process that is to be performed and depending on the reactance associated with the particular polarity reversing circuit used. That is, the polarity reversing circuit may provide sufficient reactance to act as a constant current source which would obviate the need for the power converter circuit 217 to act as a constant current source. Accordingly, the present invention should not be regarded as limited to use with a power converter circuit 217 acting as a constant current source.

Assuming that such rectifier circuits 213 and power converter circuits 217 are desired or required, the rectifier circuit 213 and the power converter circuit 217 may comprise any of a wide variety of circuits well-known in the art suitable for performing the functions of those respective circuits. However, since such rectifier circuits (e.g., circuit 213) and power converter circuits (e.g., 217) are well known in the art and are not essential to the understanding of the present invention, the particular rectifier and power converter circuits 213, 217 used in one preferred embodiment of the invention will not be described in further detail.

If a DC plasma sputter deposition process is to be performed, the negative (−) terminal of the power supply 212 is connected to the first electrode 214, whereas the positive (+) terminal is connected to the second electrode 216. The first and second electrodes 214, 216 may be connected to the power supply 212 by any of a wide range of electrical conductors, such as by a pair of wires 222, 224. When connected in this manner, the first electrode 214 is referred to as the cathode while the second electrode 216 is referred to as the anode.

As was the case for the first two embodiments 10 and 110 described above, the first and second electrodes 214, 216 are positioned within a vacuum chamber 218 and may be configured in any of a variety of ways well-known in the art depending on the particular plasma process to be performed. For example, if sputter deposition processes are to be performed within the chamber 218, a target (not shown) may be connected as the cathode (i.e., first electrode) 214. The second electrode or anode 216 may comprise a separate component or, as is commonly the case, may comprise the vacuum chamber 218 itself. Of course, the vacuum chamber 218 may also include a variety of other components and devices necessary to accomplish the desired plasma process.

For example, the vacuum chamber 218 may be connected to a supply of a suitable process gas (not shown), such as argon, as well as to suitable pumping apparatus (also not shown) to maintain the process gas contained within the chamber 218 at the desired pressure. If reactive sputtering processes are to be performed, then the vacuum chamber 218 also may be provided with a supply of a suitable reactive species (not shown), such as oxygen, although other reactive species are known and may be used. A valve assembly (not shown) may also be provided to allow for the precise adjustment of the flow of the reaction gas into the chamber 218. Of course, the vacuum chamber 218 may be provided with various other systems, e.g., cooling systems, process monitoring systems, etc., all of which are well-known in the art and could be provided by persons having ordinary skill in the art. Consequently, the vacuum chamber 218 will not be described in further detail.

The polarity reversing circuit 210 may comprise a first inductor 226 connected in series with the negative (−) terminal of the power supply 212 and the first electrode (i.e., cathode) 214. The first inductor 226 adds a substantial amount of reactance to the circuit 210, thereby allowing the plasma process to operate at substantially constant current, at least for short term transient impedance variations likely to occur in the plasma 220. The amount of inductance of the first inductor 226 is not particularly critical, and it is only necessary to provide an inductance of sufficient size to allow the plasma process to be operated at substantially constant current for the typically expected transient impedance variations in the plasma 220. By way of example, the first inductor 226 may have an inductance of about 1.5 millihenries (mH), although other inductances may also be used.

The cathode 248 of diode 234 is also connected to the first electrode 214, whereas the anode 250 of diode 234 is connected to one plate of the first capacitor 230. The other plate of first capacitor 230 is connected to the negative (−) terminal of the power converter circuit 217. The series arrangement of the first capacitor 230 and diode 234 forms a voltage limiter or clamp to prevent excessive negative voltages from being imposed on the first electrode 214 when the switching device 236 is opened. The size of diode 234 will, of course, depend on the capacity of the particular power supply 212, the expected peak voltages and currents, as well as the values chosen for the other components in the circuit 210. However, in one preferred embodiment, the diode 234 may comprise a single diode rated for 800 volts (V) and 6 amperes (A). Alternatively, a combination of diodes may be used, as would be obvious to persons having ordinary skill in the art.

The value of the first capacitor 230 must be selected so that it will not discharge significantly during the longest conducting period of switching device 236 at the maximum load current, i.e., the time between $t_1$ and $t_2$ (FIG. 2). Further, the LC resonant circuit that comprises the first and second capacitors 230 and 232 and the second inductor 228 should have a sufficiently long time constant so that the second capacitor 232 will be positively charged when the switching device 236 is again switched to the conducting state. However, this consideration is diminished to some degree since the bi-directional converter circuit 211 assists in maintaining the charge on the second capacitor 232. The range of values for the first capacitor 230 will be described later.

The second capacitor 232 and the switching device 236 are connected in series across the first and second electrodes 214 and 216 in the manner shown in FIG. 6. It is preferred, but not required, that a first resistor 238 be connected in series between the capacitor 232 and the cathode 214, and a second resistor 240 be connected in series between the switching device 236 and the anode 216. Although both resistors 238 and 240 act as current limiters to protect their associated components, resistor 240 also provides current limiting information to the switch actuation circuit 242, as was described above. In one preferred embodiment, the first resistor 238 may have a value in the range of 1 ohm (Ω) to 50 Ω (8 Ω preferred). The second resistor 240 may have a value in the range of 10 milliohms (mΩ) to 100 mΩ (50 mΩ preferred). Finally, the second inductor 228 is connected between the first and second capacitors 230 and 232, respectively.

As was the case for the first two embodiments 10 and 110, the first and second capacitors 230 and 232, along with the second inductor 228, form an LC resonant circuit. In order to provide good performance, the time constant of the resonant circuit should be selected so that it is at least four (4) times longer than the expected length of the non-conducting period of switching device 236 (i.e., the period between $t_2$ and $t_3$, FIG. 2) at the slowest cycle rate. It is preferred, but not required, that the time constant of the LC resonant circuit be about one (1) order of magnitude (i.e., about 10 times) longer than the length of the non-conducting period (i.e., $t_3$–$t_2$). Thus, in one preferred embodiment having a non-conducting time period $t_3$–$t_2$ in the range of 20–60 microseconds (μs), the time constant of the resonant circuit should be selected to be about 600 μs. Therefore, any values for the second inductor 228 and the first and second capacitors 230 and 232 that will yield such a time constant usually will suffice. In one preferred embodiment, the first capacitor 230 has a value in the range of about 1 microfarad (μF) to 10 μF (1 μF preferred), the second capacitor 232 a value in the range of 1 μF to 10 μF (1 μF preferred), and the inductor 228 has a value of about 5 millihenries (mH) to 10 mH (10 mH preferred).

The switching device 236 may comprise any number of semiconductor switching devices suitable for switching the anticipated currents at a suitable speed (e.g., 0.1 μs). Examples of such semiconductor switching devices include, but are not limited to, bi-polar transistors, insulated gate bi-polar transistors (IGBTs), field-effect transistors (FETs), metal-oxide semiconductor field-effect transistors (MOSFETs), etc., that are readily commercially available and well-known to persons having ordinary skill in the art. Alternatively, non-semiconductor switching devices may also be used, provided such devices are capable of switching the anticipated voltages and currents at the speeds required. In one preferred embodiment, the switching device 236 may be identical to the switching device 36 already described.

The switch actuation circuit 242 actuates the switching device 236 to change it from a non-conducting state to a conducting state. In one preferred embodiment, the switch actuation circuit 242 is identical to the switch actuation circuit 42 shown and described above and accomplishes the actuation of switching device 236 by applying the appropriate base current to the transistor 54 (FIG. 3) to switch it from a non-conducting state to a conducting state at the desired time intervals. That is, the switch actuation circuit 242 should be designed to provide a switch actuation signal 270 to the switching device 236 at any of a range of frequencies suitable for providing an acceptable level of arc suppression for the particular plasma process being performed. In one preferred embodiment adapted for a reactive sputter deposition process, the switch actuation circuit 242 activates (i.e., closes) the switching device 236 for about 2–5 μs (i.e., the reverse polarity cycle time 52 shown in FIG. 2), at a frequency of about 50 kilohertz (kHz), although other cycle times 52 and frequencies could also be used.

The switch actuation circuit 242 may also include an arc detection circuit 244 capable of detecting the presence of an arc condition in the chamber. Here again, the arc detection circuit 244 may be identical to the arc detection circuit 44 shown in FIG. 4 and described above, thus will not be described in further detail.

The bi-directional converter circuit 211 comprises a power supply side 227 and a chamber side 229. The power supply side 227 is connected to respective positive (+) and negative (−) nodes 231, 233 in the power supply circuit 212 by respective conductors or wires 235, 237. In one preferred embodiment, the respective positive and negative nodes 231, 233 are located between the rectifier circuit 213 and the power converter circuit 217. However, the power supply end 227 of bi-directional converter 211 could also be connected to other positive and negative nodes (not shown) contained within the power supply circuit 212.

The chamber side 229 of the bi-directional converter circuit 211 is connected across the second capacitor 232 and first resistor 238 by a pair of conductors or wires 239, 241, as best seen in FIG. 6. Alternatively, however, the chamber side 229 may be connected directly across the plates of the second capacitor 232. In still another embodiment, the chamber side 229 of the bi-directional converter circuit 211 could be connected across the first capacitor 230. However, the voltage fluctuations across the first capacitor 230 are such that the response time of the bi-directional converter circuit 211 would be considerably slower. That is, the bi-directional converter circuit 211 would not be capable of correcting energy imbalances as quickly as when the chamber side 229 is connected across the second capacitor 232.

Referring now to FIG. 7, the bi-directional converter circuit 211 comprises a transformer assembly 243 which allows power to be transferred from the power supply 212 (FIG. 6) to the polarity reversing circuit 210 when operated in the "forward mode," and from the polarity reversing circuit 210 to the power supply 212 when operated in the "reverse mode." No power transfer occurs when the converter circuit 211 is operated in the "standby mode." Essentially, transformer 243 comprises a first winding 245 and a second winding 247. The first and second windings 245, 247 are wound so that the transformer 243 has polarity characteristics indicated by the dots shown in FIG. 7. One end of the first winding 245 is connected to conductor 235, while the other end is connected to conductor 237 through the first winding switching device 249. As will be explained in greater detail below, a current sensor 251 may be optionally connected between the first winding 245 and the first winding switching device 249. The second winding 247 of transformer 243 and the second winding switching device 253 are connected in series across the conductors 239 and 241.

The turn ratio of the transformer 243, i.e., the number of turns of the first winding 245 to the second winding 247, is dictated by the voltage potential between the positive and negative nodes 219, 221 at the power supply 212 and the range of voltage potentials expected to be across the second capacitor 232. Consequently, the transformer 243 may have any of a wide range of turn ratios depending on the particular circuit in which it is used and the present invention should not be considered as being limited to any particular turn ratio or range of turn ratios. By way of example, in one preferred embodiment of the invention the voltage potential on the power supply side 227 (FIG. 6) of the bi-directional converter circuit 211 is in the range of about 250–375 volts, whereas the maximum voltage potential expected across the chamber side 229 (i.e., across the second capacitor 232) during the forward mode of operation is about 150 volts. Accordingly, the first winding 245 of transformer 243 comprises about 43 turns of wire, whereas the second winding 247 comprises about 26 turns of wire.

The current through the first winding 245 of transformer 243 is controlled by the first winding switching device 249 during the forward mode of operation. When first winding switching device 249 is in the non-conducting or open state, no current flows from conductor 235 to conductor 237. However, when the first winding switching device 249 is in the conducting or closed state, then current can flow from conductor 235 to conductor 237. Switching device 249 may comprise any of a wide range of devices suitable for switching the anticipated currents and voltages at suitable speeds (e.g., 0.2 μs). Examples of suitable switching devices include, but are not limited to, MOSFETS, FETS, IGBTs, and bi-polar transistors. Alternatively, non-semiconductor switching devices may also be used, provided such devices are capable of switching the anticipated voltages and currents at the speeds required. By way of example, in one preferred embodiment of the invention the first winding switching device 249 comprises a power MOSFET rated at 1000 V and 6A, such as type IXFH6N10, available from IXYS Corporation of Santa Clara, Calif. If a MOSFET is utilized, then the internal body diode 265 located across the drain and source (D-S) terminals provides a path for reverse current flow when the bi-directional converter 211 is operated in the "reverse mode," as will be described in greater detail below. Consequently, it may be necessary to provide an external diode (not shown), or a similar device, to provide functional equivalence (i.e., a path for reverse current flow) if another type of switching device is used.

The current through the second winding 247 of transformer 245 is controlled by a second winding switching device 253 during the reverse mode of operation. When the second winding switching device 253 is in the non-conducting or open state, no current will flow from conductor 239 to conductor 241. When the second winding switching device 253 is in the conducting or closed state, current will flow from conductor 239, through second winding 247 and conductor 241 and on though wire 241. As was the case for the first winding switching device 249, the second winding switching device 253 may comprise any of a wide range of switching devices suitable for switching the expected currents and voltages and at suitable speeds. Exemplary switching devices include, but are not limited to, MOSFETs, FETS, IGBTs, and bi-polar transistors. Alternatively, non-semiconductor switching devices may also be used, provided such devices are capable of switching the anticipated voltages and currents at the speeds required. In one preferred embodiment, switching device 253 comprises a power MOSFET rated for 1000 V and 6A, such as type IXFH6N10 available from IXYS Corporation of Santa Clara, Calif. Again, if a power MOSFET is utilized, then the internal body diode 267 located across the drain and source (D-S) terminals will provide the necessary path for reverse current flow when the bi-directional converter 211 is operated in the "forward mode." However, it may be necessary to provide an external diode (not shown), or other similar device, to provide a path for such reverse current flow if another type of switching device is used.

The first and second winding switching devices 249 and 253 are controlled by respective first and second control circuits 255 and 257. The first control circuit 255 includes a pulse generator circuit 269 which produces a first winding switch actuation signal 259. The switch actuation signal 259 switches the first winding switching device between the non-conducing and the conducting states. While any of a wide range of pulsing devices can be used to provide a switch actuation signal 259 suitable for actuating the first winding switching device 249, in one preferred embodiment of the invention the pulse generator circuit 249 comprises a pulse width modulation (PWM) circuit for producing an output signal 259 having varying pulse widths. Such a pulse width modulated signal 259 will allow the "on" time of the first winding switching device 249 (i.e., the time when the first winding switching device 249 is in the conducting state) to be controlled by varying the width of the pulses comprising the actuation signal 259. In one preferred embodiment, the frequency of the first switch actuation signal 259 may be about 50 kilohertz (kHz), although other frequencies could also be used.

The first pulse generator circuit 269 may comprise any of a wide variety of pulse generating circuits known in the art, and the present invention should not be regarded as limited to any particular circuit type or topology. However, by way of example, the pulse generator circuit 269 used in one preferred embodiment of the invention comprises a type UCC3804N, available from Unitrode Integrated Circuits Corporation of Merrimack, N.H.

As was mentioned above, an optional current sensor 251 may be connected in series between the first winding 245 of transformer 243 and the first winding switching device 249. The current sensor 251 provides a current feedback signal 272 to the first pulse generator 269 to turn off the first pulse generator 269 in the event the current flowing through winding 245 exceeds a predetermined value. The current sensor 251 therefore acts as a safety device to protect the bi-directional converter circuit 211 from damage due to excessive current flow. By way of example, the optional current sensor 251 used in one preferred embodiment of the invention turns off the pulse generator 269 when the current flow through winding 245 exceeds about 5A. The current sensor may comprise any of a wide range of devices well-known in the art for sensing current flow in a wire and for producing an output signal suitable for turning off the pulse generator 269. Consequently, the optional current sensor 251 will not be described in further detail.

The first control circuit 255 may also optionally include a slope compensation circuit 279 connected to the optional current sensor 251 and to the pulse generator 269. The slope compensation circuit 279 provides an improved current feedback signal 274 for the pulse generator 269 when the current flowing through the first winding 245 is below a certain preselected value. That is, current feedback signal 272 from the current sensor 251 may comprise significant noise components that are difficult to distinguish from the low current signal. Such noise components could result in erratic operation of the pulse generator 269. The slope compensation circuit 279 cleans up the current feedback signal 272 and provides an improved current feedback signal 274 to the pulse generator 269. Since slope compensation circuits of the type described above are well-known and could be easily provided by persons having ordinary skill in the art after having become familiar with the teachings of this invention, the particular slope compensation circuit used in one preferred embodiment of the present invention will not be described in further detail.

The second control circuit 257 includes a second pulse generator circuit 271 which produces a switch actuation signal 261 suitable for controlling the second winding switching device 253. As was the case for the first pulse generator 269, the second pulse generator circuit 271 comprises a pulse width modulation (PWM) circuit. However, unlike the first pulse generator circuit 269, the second pulse generator circuit 271 is operated so that it does not vary the pulse width of the switch actuation signal 261. Instead, the second pulse generator 271 produces an output signal 261 having a constant pulse width. The constant pulse width of switch actuation signal 261 provides a constant duty cycle for the second winding switching device 253. Consequently, when the bi-directional converter circuit 211 is operated in the "reverse mode" the pulse generator circuit 271 does not regulate the voltage across the capacitor 232 in the same way as does the first pulse generator 269 when the converter operates in the "forward mode." Instead, when operating in the "reverse mode" the voltage across the second capacitor 232 is regulated between $V_2$ and $V_3$ by simply switching the converter circuit 211 between the "reverse" and "standby" modes, as will be described in greater detail below.

It should be noted, however, that the second control circuit 257 could be provided with voltage regulating capacity by providing the voltage detector circuit 263 with a voltage detector that produces a proportional voltage feedback signal, as opposed to the simple "on-off" voltage feedback signal provided by comparator 289, as will be described in greater detail below. Consequently, the present invention should not be regarded as limited to the foregoing non-PWM circuit function of the second pulse generator 271.

As was the case for the first pulse generator circuit 269, the second pulse generator circuit 271 may comprise any of a wide variety of pulse generating circuits known in the art. Consequently, the present invention should not be regarded as limited to any particular circuit type or topology. However, by way of example, the second pulse generator circuit 271 used in one preferred embodiment of the invention comprises a type UCC3804N, available from Unitrode Integrated Circuits Corporation of Merrimack, N.H.

The switch actuation signal 261 produced by the second pulse generator circuit 271 has a frequency of about 100 kHz, i.e., approximately twice the frequency of the first switch actuation signal 259, which has a frequency of about 50 kHz. The increased frequency of the second switch actuation signal 261 provides for better matching (i.e., energy transfer) between the first and second windings 245, 247 of transformer 243. For maximum efficiency, the ratio of the frequencies of the first and second switch actuation signals 259, 261 should be about equal to the turns ratio of the second winding 247 to the first winding 245. Accordingly, in one preferred embodiment wherein the transformer 243 has a turns ratio (second winding 247 to the first winding 245) of 26:43 (i.e., approximately 1:1.65), the frequency ratio of the first and second switch actuation signals 259 and 261 is 50 kHz: 100 kHz or 1:2.

Both the first and second pulse generator circuits 269 and 271 are connected to the voltage detector circuit 263 which actuates the first and second pulse generators 269 and 271 depending on the voltage across the second capacitor 232. For example, when the detected voltage across the second capacitor 232 is less than or equal to the first voltage $V_1$ (FIG. 8), the voltage detector circuit 263 turns on the first pulse generator 269 via a voltage feedback signal 297 carried by control line 273. The first pulse generator 269 in turn regulates the voltage across the second capacitor to substantially $V_1$ by utilizing the voltage feedback signal 297 produced by the voltage detector 263 and by varying the pulse widths of the switch actuation signal 259. When the voltage across the second capacitor 232 exceeds the first voltage $V_1$ by a predetermined tolerance (e.g., 0.1–5 volts) the voltage feedback signal 297 turns off the pulse generator 269.

As will be described in greater detail below, the voltage detector circuit 263 may include an optional lockout voltage detector circuit 283 (FIG. 9) which sends a lockout signal 285 to the pulse generator 269 via control line 275. The lockout signal 285 is produced when the voltage across the second capacitor 232 exceeds a lockout voltage $V_{lockout}$ (FIG. 8) which is intermediate $V_1$ and $V_2$. The lockout signal 285 provides an additional assurance that the "forward mode" of operation will be disabled before the "reverse mode" of operation is enabled.

The second pulse generator 271 is controlled by the voltage detector 263 via control line 277. That is, when the voltage across the capacitor 232 increases to $V_3$, the voltage detector 263 turns on the pulse generator 271 to switch the bi-directional converter 211 to the "reverse mode." The circuit 211 operates in the "reverse mode" until the voltage across the second capacitor 232 decreases to $V_2$, at which time the voltage detector 263 turns off the second pulse generator 271 and the circuit 211 enters the "standby mode."

The voltage detector circuit 263 may comprise any of a wide range of circuits known in the art for detecting voltage levels and for generating output signals to control the first and second pulse generators 269 and 271 in the manner just described. Consequently, the present invention should not be regarded as limited to any particular type of voltage detector or voltage detector circuit architecture. However, by way of example, the voltage detector circuit 263 used in one preferred embodiment of the present invention is shown in FIG. 9 and will now be described.

Figure 9:
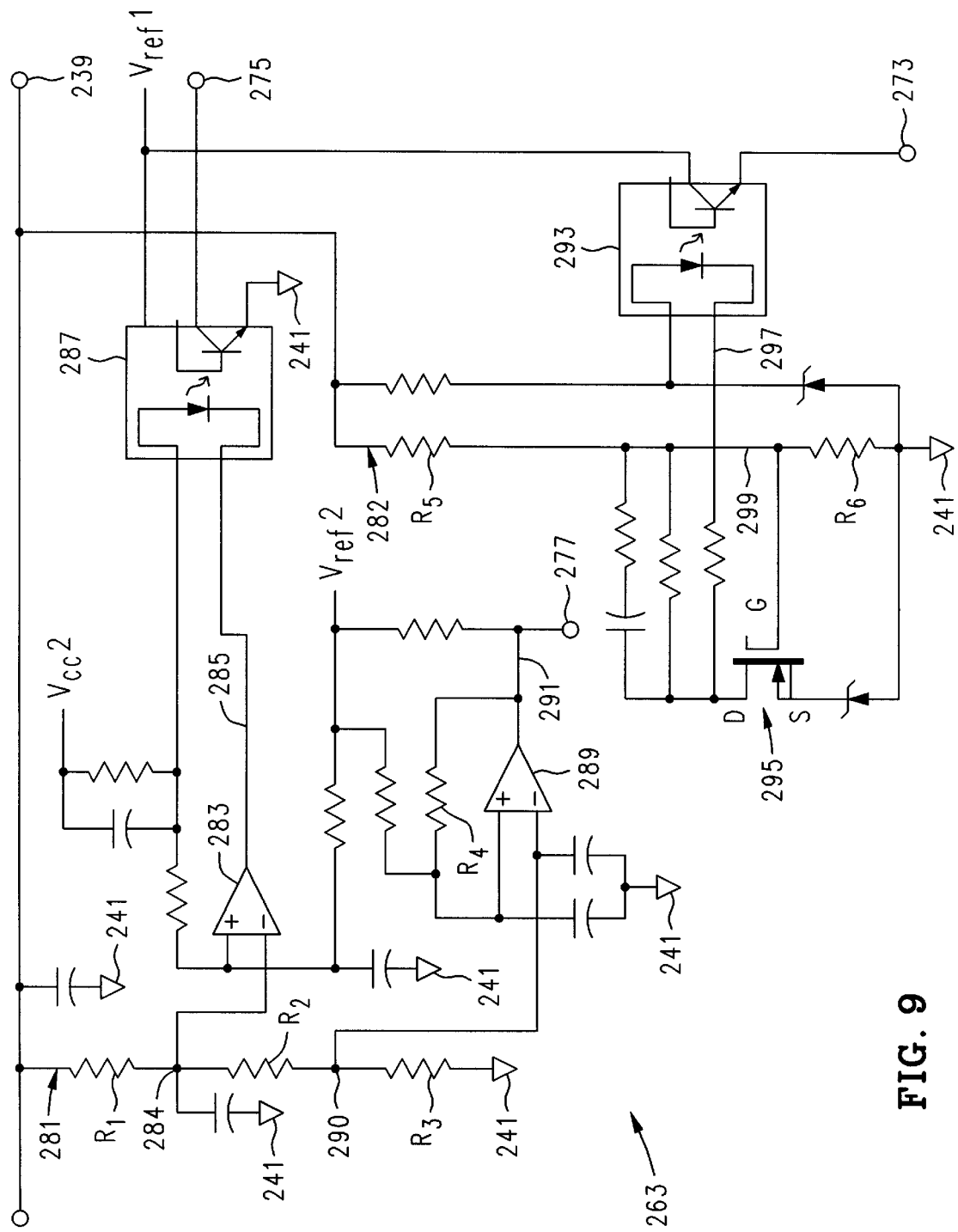
FIG. 9 is a schematic of one embodiment of the voltage detector circuit shown in FIG. 7.

Essentially, the voltage detector circuit 263 may comprise a first voltage divider network 281 comprising three (3) resistors R1, R2, and R3 connected in series across conductors 239 and 241 (conductor 241 is indicated throughout FIG. 9 as the "▽" symbol). A first or "lockout" comparator 283 is connected to the node 284 between R1 and R2. The lockout comparator 283 produces a lockout (i.e., a "turn off") signal 285 when the voltage at the node 284 exceeds a reference voltage derived from $V_{ref2}$, which can be any convenient reference voltage. This voltage corresponds to the "lockout" voltage $V_{lockout}$ shown in FIG. 8. Put in other words, the output signal 285 is essentially the "lockout signal" that is used to deactivate the first pulse generator 269 (if it is not already deactivated) when the voltage across the capacitor 232 exceeds the lockout voltage $V_{lockout}$. The lockout comparator 283 is connected to an optical isolator circuit 287 which electrically isolates the first control circuit 255 from the second control circuit 257. The lockout signal 285 is then directed to the first pulse generator 269 via control line 275.

A second comparator or Schmitt trigger 289 is connected to the node 290 between R2 and R3 and generates a "low" output signal 291 (i.e., a "turn on" signal) when the voltage at node 290 is greater than or equal to a another reference voltage derived from $V_{ref2}$. This voltage corresponds to the third voltage $V_3$ (FIG. 8). In accordance with the architecture of a Schmitt trigger, a feedback resistor R4 introduces hysteresis into the trigger 289. That is, the output signal 291 will go "high" (i.e., generate a "turn off" signal) when the voltage at node 290 decreases to the second voltage $V_2$. The output signal 291 is then directed to the second pulse generator 271 via control line 277. Accordingly, the output signal 291 turns on the second pulse generator 271 when the voltage across the second capacitor 232 exceeds $V_3$ and turns off the pulse generator 271 when the voltage across the second capacitor 232 decreases to $V_2$.

The detection of the first voltage, i.e., $V_1$, used to turn on the first pulse generator 269 is accomplished by a second voltage divider network 282 comprising resistors R5 and R6 connected in series across conductors 239 and 241. A MOSFET 295 having its gate G connected to the node 299 between resistors R5 and R6 produces an output or voltage feedback signal 297 that is related to the voltage across the second capacitor 232 (FIG. 6). The voltage feedback signal 297 drives a second optical-isolator circuit 293 which in turn controls the first pulse generator 269 via control line 273. That is, the output or voltage feedback signal 297 is used by the first pulse generator circuit 269 to vary the pulse width of the switch actuation signal 259, which in turn regulates the voltage across capacitor 232 to substantially $V_1$.

When the voltage across capacitor 232 exceeds $V_1$ by some predetermined tolerance (e.g., 0.1–5 V), the voltage feedback signal 297 turns off the first pulse generator 269, causing the bi-directional converter circuit 211 to enter the "standby mode" of operation. As mentioned above, if the voltage across the second capacitor 232 is also above the lockout voltage $V_{lockout}$, the voltage detector 263 also provides a lockout signal 285 to the pulse generator 269 to ensure that it remains turned off.

As was described above, the bi-directional converter circuit 211 may be operated in one of three modes depending on whether energy needs to be transferred to or removed from the polarity reversing circuit 210. The three modes, i.e., forward, standby, and reverse, will now be described seriatim.

Referring now primarily to FIG. 7, when the bi-directional converter circuit 211 is operated in the "forward mode," the first pulse generator 269 is activated and produces pulsed output signal 259 which switches first winding switching device 249 between the conducting and non-conducting states in proportion to the width of the pulses of the output signal 259. Put in other words, the duty cycle or percent "on" time of first winding switching device 249 is controlled by the pulse width of the PWM signal 259. The second pulse generator 271 is deactivated during the "forward mode" operation. That is, the second winding switching device 253 is in the non-conducting or "off" state.

During the "on" time of the first winding switching device 249, i.e., when first winding switching device 249 is in the conducting state, current flow $i_p$ in the power supply side 227 flows from conductor 235, through the first winding 245, optional current sensor 251, and first winding switching device 249. The current flow $i_p$ then returns to the power supply 212 via conductor 237. Accordingly, current $i_p$ in the power supply side 227 flows in the direction indicated by the "forward" arrow in FIG. 7 during the "forward mode." Then, when the first winding switching device 249 is turned off (i.e., is switched to the non-conducting state), current flow $i_p$ in the power supply side 227 decays and energy stored in the magnetic field (not shown) produced by the current flow $i_p$ in the first winding 245 induces a current flow $i_c$ in the second winding 247. The current flow $i_c$ in the chamber side 229 flows from conductor 241, through body diode 267 and second winding 247, and on to conductor 239. That is, the current flow $i_c$ in the chamber side 229 of the bi-directional converter 211 flows in the direction indicated by the "forward" arrow when the bi-directional converter circuit operates in the "forward mode." The current flow $i_c$ in the chamber side 229 of the circuit 211 increases the charge (i.e., voltage potential) on capacitor 232 (FIG. 6), thereby increasing the energy in the polarity reversing circuit 210. The voltage feedback signal 297 (FIGS. 7 and 9) from the voltage detector circuit 263 is used to control the duty cycle or "on" time of the first winding switching device 249, thereby regulating the voltage across capacitor 232 to approximately $V_1$.

When the bi-directional converter circuit 211 is operated in the "standby" mode, neither the first pulse generator 269 nor the second pulse generator 271 is activated. Consequently, no current flows in either the power supply side 227 or the chamber side 229, and no energy is transferred to or from the polarity reversing circuit 210.

In the "reverse mode" of operation, the first pulse generator 269 is de-activated but the second pulse generator 271 is activated. The second pulse generator 271 produces an output signal 261 that switches the second winding switching device 253 between the non-conducting (i.e., "off") state and the conducting (i.e., "on") state. When the second winding switching device 253 is in the conducting state, current $i_c$ flows from conductor 239, through second winding 247 and second winding switching device 253, and returns through conductor 241. That is, the current $i_c$ flows in the direction indicated by the "reverse" arrow shown in FIG. 7. This reverse current flow $i_c$ discharges the second capacitor 232. When the second winding switching device 253 is switched to the "off" or non-conducting state, the current flow $i_c$ through the second winding 247 decays. The collapsing magnetic field (not shown) in the transformer 243 induces a current $i_p$ in the first winding 245 that flows in the direction indicated by the "reverse" arrow. That is, current $i_p$ in the power supply side 227 flows from conductor 237, through body diode 265, current sensor 251, first winding 245 and back to the power supply 212 via conductor 235. This current flow $i_p$ transfers energy back to the power supply 212 (FIG. 6).

The effects of the various modes of operation of the bi-directional converter circuit 211 are best understood by referring to FIGS. 6–8. In FIG. 8, the voltage across the second capacitor 232 is indicated along the ordinate (i.e., the vertical axis) and time is indicated along the abscissa (i.e., the horizontal axis).

Consider, for example, the operation of a hypothetical plasma processing system beginning at a time t=0, at which time power from the alternating current source 215 is connected to the power supply assembly 212. At this point in time, the power converter circuit 217 is disabled or turned "off" and no voltage potential exists across its positive (+) and negative (−) terminals. However, rectifier circuit 213 and the bi-directional power converter circuit 211 are enabled. The bi-directional power converter circuit 211 operates in the "forward mode" to charge the second capacitor 232. Once the second capacitor 232 has been charged to $V_1$, i.e., at a time $t_1$, the polarity reversing circuit 210 is activated (i.e., the switching device 236 is periodically opened and closed by the switch actuation circuit 242). Also, if the polarity reversing circuit 210 is provided with the optional arc detection circuit 244, then the arc detection circuit 244 may also be enabled at this time (i.e., $t_1$). Accordingly, during the time from. t=0 to t=$t_1$ the bi-directional converter circuit 211 operates in the "forward mode," i.e., transfers energy from the power supply circuit 212 to the polarity reversing circuit 210.

By way of example, the first voltage $V_1$ may be 150 volts, although $V_1$ could be nearly any voltage, depending on the particular circuit and process being performed. Also, it should be noted that for ease of illustration the voltage increases and decreases across capacitor 232 are shown in FIG. 8 as increasing and decreasing in a linear fashion. However, this may not necessarily be the case. Instead, the voltage across capacitor 232 could also increase and decrease in a non-linear fashion. After the polarity reversing circuit 210 has been activated, the power converter circuit 217 may be enabled or turned "on" to accomplish and maintain the plasma process being performed within the chamber 218. The first control circuit 255 of the bi-directional converter 211 controls the first winding switching device 249 as necessary to regulate the voltage across capacitor 232 to substantially $V_1$. Specifically, the voltage feedback signal 297 causes the first pulse generator 269 to vary the widths of the pulses of the switch actuation signal 259, thus varying the "on" time of the first winding switching device 249. In this hypothetical example, the plasma process operates in this more or less steady state (i.e., with the bi-directional converter circuit 211 operating in the "forward mode" and maintaining the voltage across the second capacitor 232 at $V_1$) until a time $t_2$, at which time conditions in the chamber 218 change in such a way that the energy reflected by the process chamber 218 exceeds the energy requirements of the polarity reversing circuit 210. The surplus reflected energy (i.e., that amount of the reflected energy that is in excess of the energy required by the polarity reversing circuit 210) results in an increase in the voltage across the second capacitor 232.

When the voltage across the capacitor 232 increases beyond the first voltage $V_1$ at a time $t_2$ the first control circuit turns off (i.e., the first winding switching device 249 is placed in the non-conducting state). Since the second winding switching device 253 is also in the non-conducting state, the bi-directional converter is now operating in the "standby mode." That is, no energy is transferred between the power supply 212 and the polarity reversing circuit 210.

If conditions in the chamber 218 are such that surplus energy continues to be reflected by the chamber 218 back to the polarity reversing circuit 210, the result will be a continuing increase in the voltage across the second capacitor 232. The bi-directional converter circuit 211 operates in this "standby mode" until the voltage across capacitor 232 reaches a third voltage $V_3$, at a time $t_3$. By way of example, in one preferred embodiment the third voltage $V_3$ corresponds to about 250 volts. At this time, i.e., time $t_3$, the bi-directional converter 211 begins to operate in the "reverse mode." Specifically, the voltage detector circuit 263 turns on the second pulse generator 271. The output signal 261 produced by the second pulse generator 271 switches the second winding switching device 253 between the conducting and non-conducting states. When operating in the "reverse mode," the bi-directional converter circuit 211 transfers energy from the polarity reversing circuit 210 to the power supply 212 in the manner described above. The "reverse mode" of operation decreases the voltage across the second capacitor 232. The converter circuit 211 continues to operate in the "reverse mode" until the voltage across the capacitor 232 drops to an intermediate voltage $V_2$ at a time $t_4$, at which time the converter circuit 211 again enters the "standby mode." By way of example, the second voltage $V_2$ in one preferred embodiment corresponds to a voltage of about 200 volts. The bi-directional converter circuit 211 continues to operate between the "standby" and "reverse" modes to maintain the voltage across the second capacitor 232 between $V_2$ and $V_3$.

Suppose now that at a time $t_5$ conditions in the chamber 218 again change, but this time so that the energy reflected back to the polarity reversing circuit 210 is less than the energy requirements of the circuit 210. This type of operating condition will result in a steady decrease in the voltage across capacitor 232. Once the voltage across capacitor 232 decreases below $V_2$ (i.e., at a time $t=t_6$) the bi-directional converter circuit 211 again switches to the "standby mode" and remains in the "standby mode" until the voltage across capacitor 232 decreases to $V_1$ at a time $t_7$. The bi-directional converter circuit 211 then switches to the "forward mode" of operation.

Note that while the bi-directional converter circuit 211 will usually maintain the voltage across capacitor 232 at substantially $V_1$, certain chamber conditions may make this impossible. That is, the energy reflected by the chamber 218 may be less than that which can be compensated for by the bi-directional converter circuit 211. This condition is illustrated in FIG. 8, wherein after time $t_7$ it may only be possible to maintain the voltage across the second capacitor 232 at some voltage less than $V_1$. Of course, a bi-directional converter circuit having a larger capacity could be provided, in which case the larger capacity converter circuit may be capable of maintaining the voltage across capacitor 232 at substantially $V_1$ under practically all conditions, except a short circuit.

If the voltage detector circuit 263 is provided with the lockout circuit, it will generate a lockout signal 285 when the voltage across the capacitor 232 exceeds the lockout voltage $V_{lockout}$. The lockout signal 285 will be removed when the voltage drops below the lockout voltage $V_{lockout}$. As was discussed above, the lockout signal provides additional assurance that the first pulse generator will remain deactivated when the voltage across the capacitor 232 is greater than $V_{lockout}$. By way of example, in one preferred embodiment, the lockout voltage $V_{lockout}$ corresponds to a voltage of about 175 volts.

This completes the detailed description of the preferred embodiments of the invention. While a number of specific components were described above for the preferred embodiments of this invention, persons skilled in this art will readily recognize that other substitute components or combinations of components may be available now or in the future to accomplish comparable functions to the apparatus described herein. Therefore, it is contemplated that the inventive concepts herein described may be variously otherwise embodied and it is intended that the appended claims be construed to include alternative embodiments of the invention except insofar as limited by the prior art.

What is claimed is:

1. A polarity reversing circuit for reversing a voltage polarity on a first electrode and a second electrode, comprising:

a first inductor;

means for connecting said first inductor between the first electrode and a negative terminal of an external power supply;

means for connecting the second electrode to a positive terminal of the external power supply;

a diode having a cathode and an anode;

means for connecting the cathode of said diode to the first electrode;

a first capacitor;

means for connecting said first capacitor between the anode of said diode and the negative terminal of the external power supply;

a second inductor having a first lead and a second lead;

means for connecting the first lead of said second inductor to the anode of said diode;

a second capacitor;

means for connecting said second capacitor between the second lead of said second inductor and the first electrode;

switching means connected between the second lead of said second inductor and the positive terminal of the external power supply for selectively connecting the second lead of said second inductor to the positive terminal of the external power supply in response to a switch actuation signal; and bi-directional converter means connected across said second capacitor and connected to the external power supply for transferring electrical energy between said polarity reversing circuit and the external power supply.

2. The polarity reversing circuit of claim 1, wherein said bi-directional converter means maintains a voltage on said second capacitor between a maximum voltage and a minimum voltage.

3. The polarity reversing circuit of claim 2, wherein said bi-directional converter means comprises:

a transformer having a first winding and a second winding, the first winding of said transformer being connected across the external power supply and the second winding being connected across said second capacitor;

a first winding switching device connected in series between the first winding of said transformer and the external power supply;

a second winding switching device connected in series between the second winding of said transformer and said second capacitor; and winding switching device control means connected to said first and second winding switching devices for selectively switching each of said first and second winding switching devices between a conducting state and a non-conducting state.

4. The polarity reversing circuit of claim 3, wherein said winding switching device control means comprises:

a first control circuit connected to said first winding switching device; and a second control circuit connected to said second winding switching device.

5. The polarity reversing circuit of claim 4, wherein said second control circuit comprises voltage detector means connected across said second capacitor for producing a plurality of control signals relating to a detected voltage across said second capacitor.

6. The polarity reversing circuit of claim 5, wherein said first control circuit and said second control circuit are connected to said voltage detector means and are responsive to the control signals produced thereby.

7. The polarity reversing circuit of claim 6, further comprising current sensing means connected in series between said first winding switching device and said first winding of said transformer for sensing a current flowing in said first winding.

8. The polarity reversing circuit of claim 6, wherein said first control circuit includes a first pulse generator connected to said first winding switching device and to said voltage detector means, said first pulse generator producing a first winding switch actuation signal for switching said first winding switching device between the conductive state and the non-conductive state.

9. The polarity reversing circuit of claim 8, wherein said second control circuit includes a second pulse generator connected to said second winding switching device and to said voltage detector means, said second pulse generator producing a second winding switch actuation signal for switching said second winding switching device between the conductive state and the non-conductive state.

10. The polarity reversing circuit of claim 9, wherein said plurality of control signals produced by said voltage detector means comprise:

a first control circuit activation signal for activating said first control circuit when the detected voltage across said second capacitor is less than a first voltage $V_1$ and for deactivating said second control circuit when the detected voltage across said second capacitor is greater than the first voltage $V_1$;

a second control circuit activation signal for activating said second control circuit when the detected voltage across said second capacitor is greater than a third voltage $V_3$ and for deactivating said second control circuit when the detected voltage across said second capacitor decreases to a second voltage $V_2$, the second voltage $V_2$ being between the first and third voltages $V_1$ and $V_3$.

11. The polarity reversing circuit of claim 10 wherein said first control circuit activation signal comprises a voltage feedback signal that is related to the voltage across said second capacitor.

12. A polarity reversing circuit for reversing a voltage polarity on a first electrode and a second electrode, comprising:

a first inductor connected between the first electrode and a negative terminal of an external power supply;

an electrical conductor connected between the second electrode and a positive terminal of the external power supply;

a diode having a cathode and an anode, the cathode of said diode being connected to the first electrode;

a first capacitor connected between the anode of said diode and the negative terminal of the external power supply;

a second inductor having a first lead and a second lead, the first lead of said second inductor being connected to the anode of said diode;

a second capacitor connected between the second lead of said second inductor and the first electrode;

a switch connected between the second lead of said second inductor and the positive terminal of the external power supply, said switch selectively connecting the second lead of said second inductor to the positive terminal of the external power supply in response to a switch actuation signal; and a bi-directional converter connected across said second capacitor and connected to the external power supply, said bi-directional converter transferring electrical energy between said polarity reversing circuit and the external power supply.

13. A polarity reversing circuit for reversing a voltage polarity on a first electrode and a second electrode, comprising:

a first inductor connected between the first electrode and a negative terminal of an external power supply;

an electrical conductor connected between the second electrode and a positive terminal of the external power supply;

a diode having a cathode and an anode, the cathode of said diode being connected to the first electrode;

a first capacitor connected between the anode of said diode and the negative terminal of the external power supply;

a second inductor having a first lead and a second lead, the first lead of said second inductor being connected to the anode of said diode;

a second capacitor connected between the second lead of said second inductor and the first electrode;

a switch connected between the second lead of said second inductor and the positive terminal of the external power supply, said switch selectively connecting the second lead of said second inductor to the positive terminal of the external power supply in response to a switch actuation signal; and a bi-directional converter connected across said first capacitor and connected to the external power supply, said bi-directional converter transferring electrical energy between said polarity reversing circuit and the external power supply.

14. A polarity reversing circuit for reversing a voltage polarity on a first electrode and a second electrode, comprising:

a first inductor connected between the first electrode and a first terminal of an external power supply;

conductor means for connecting the second electrode to a second terminal of the external power supply;

energy transfer means connected between the first electrode and the second electrode for temporarily storing energy from said first inductor means;

switching means operatively associated with said energy transfer means and with the first and second electrodes for selectively electrically connecting said energy transfer means between the first and second electrodes;

voltage clamping means connected between the first and second electrodes for preventing the voltage potential between the first and second electrodes from exceeding a clamped voltage potential when said switching means is switched from a conducting state to a non-conducting state; and bi-directional converter means operatively associated with said energy transfer means and connected to the external power supply for transferring electrical energy between said energy transfer means and the external power supply.

15. A method for transferring energy between a power supply and a polarity reversing circuit, the polarity reversing circuit including at least one energy storing component, comprising the steps of:

detecting an energy stored in the energy storage component;

comparing the detected energy stored in the energy storage component with a target energy level;

transferring energy from the power supply to the polarity reversing circuit if the detected energy stored in the energy storage component is less than the target energy level; and transferring energy from the polarity reversing circuit to the power supply if the detected energy stored in the energy storage component is greater than the target energy level.

16. The method of claim 15, wherein the energy storage component comprises a capacitor and wherein the step of detecting energy stored in the energy storage component comprises the step of detecting a voltage across the capacitor.

17. The method of claim 16, wherein energy is transferred from the power supply to the polarity reversing circuit when the voltage across the capacitor is less than a first voltage $V_1$.

18. The method of claim 17, wherein energy is transferred from the polarity reversing circuit when the voltage across the capacitor is greater than a third voltage $V_3$.

19. A bi-directional converter circuit for transferring energy from a power supply to a polarity reversing circuit, the polarity reversing circuit having at least one energy storage component, comprising:

means for detecting an energy stored in the energy storage component;

means for comparing the detected energy stored in the energy storage component with a target energy level;

means for transferring energy from the power supply to the polarity reversing circuit if the detected energy stored in the energy storage component is less than the target energy level; and means for transferring energy from the polarity reversing circuit to the power supply if the detected energy stored in the energy storage component is greater than the target energy level.

20. A bi-directional converter circuit for transferring energy from a power supply to a polarity reversing circuit, the polarity reversing circuit having at least one energy storage component, comprising:

a transformer having a first winding and a second winding, the first winding of said transformer being connected across the power supply and the second winding being connected across the energy storage component;

a first winding switching device connected in series between the first winding of said transformer and the power supply;

a second winding switching device connected in series between the second winding of said transformer and the energy storage component; and winding switching device control means connected to said first and second winding switching devices for selectively switching each of said first and second winding switching devices between a conducting state and a non-conducting state.

21. The bi-directional converter circuit of claim 20, wherein said winding switching device control means comprises:

a first control circuit connected to said first winding switching device; and a second control circuit connected to said second winding switching device.

22. The bi-directional converter circuit of claim 21, wherein the energy storage component comprises a capacitor and wherein said second control circuit comprises voltage detector means connected across said capacitor for producing a plurality of control signals relating to a detected voltage across said capacitor.

23. The bi-directional converter circuit of claim 22, wherein said first control circuit and said second control circuit are connected to said voltage detector means and are responsive to the control signals produced thereby.

24. The bi-directional converter circuit of claim 23, further comprising current sensing means connected in series between said first winding switching device and said first winding of said transformer for sensing a current flowing in said first winding.

25. The bi-directional converter circuit of claim 24, wherein said first control circuit includes a first pulse generator connected to said first winding switching device and to said voltage detector means, said first pulse generator producing a first winding switch actuation signal for switching said first winding switching device between the conductive state and the non-conductive state.

26. The bi-directional converter circuit of claim 25, wherein said second control circuit includes a second pulse generator connected to said second winding switching device and to said voltage detector means, said second pulse generator producing a second winding switch actuation signal for switching said second winding switching device between the conductive state and the non-conductive state.

27. The bi-directional converter circuit of claim 26, wherein said plurality of control signals produced by said voltage detector means comprise:

a first control circuit activation signal for activating said first control circuit when the detected voltage across said second capacitor is less than a first voltage $V_1$ and for deactivating said second control circuit when the detected voltage across said second capacitor is greater than the first voltage $V_1$;

a second control circuit activation signal for activating said second control circuit when the detected voltage across said second capacitor is greater than a third voltage $V_3$ and for deactivating said second control circuit when the detected voltage across said second capacitor decreases to a second voltage $V_2$, the second voltage $V_2$ being between the first and third voltages $V_1$ and $V_3$.

28. The bi-directional converter circuit of claim 27 wherein said first control circuit activation signal comprises a voltage feedback signal that is related to the voltage across said capacitor.

* * * * *